(12) United States Patent
Sun et al.

(10) Patent No.: US 10,749,546 B1
(45) Date of Patent: Aug. 18, 2020

(54) METHOD AND SYSTEM OF CONTENT BASED DYNAMIC DATA COMPRESSION

(71) Applicant: Dell Products L.P., Round Rock, TX (US)

(72) Inventors: Jun Sun, Shanghai (CN); Lin Chen, Shanghai (CN); Xiao Na Zhang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/413,064

(22) Filed: May 15, 2019

(51) Int. Cl.
*H03M 7/30* (2006.01)
*H04L 29/08* (2006.01)

(52) U.S. Cl.
CPC ........... *H03M 7/6082* (2013.01); *H04L 67/02* (2013.01)

(58) Field of Classification Search
CPC .. H03M 7/6082; H03M 7/607; H03M 7/6064; H04L 67/02
USPC ............................................ 341/51, 87, 106
See application file for complete search history.

(56) References Cited

U.S. PATENT DOCUMENTS

| | | | | |
|---|---|---|---|---|
| 5,467,087 A * | 11/1995 | Chu | ..................... | H03M 7/3086 341/51 |
| 6,885,319 B2 * | 4/2005 | Geiger | ..................... | H03M 7/30 341/51 |
| 8,427,347 B1 * | 4/2013 | Chai | ..................... | H03M 7/30 341/51 |

OTHER PUBLICATIONS

Blasiak, Sam, et al., "A Hidden Markov Model Variant for Sequence Classification," Proceedings of the Twenty-Second International Joint Conference on Artificial Intelligence, 2011, pp. 1192-1197.
Mahmud, Salauddin, "An Improved Data Compression Method for General Data", IEEE International Journal of Scientific & Engineering Research vol. 3, Issue 3, Mar. 2012, pp. 1-4.
Rabiner, Lawrence R., "A Tutorial on Hidden Markov Models and Selected Applications in Speech Recognition," Processing of the IEEE,vol. 77, No. 2, Feb. 1989, pp. 257-286.
Sahnoun, Khaled, et al. "A Hybrid DPCM-DCT and RLE Coding for Satellite Image Compression," The International Journal of Computational Science, Information Technology and Control Engineering (IJCSITCE) vol. 1, No. 1, Apr. 2014, pp. 1-6.

(Continued)

*Primary Examiner* — Khai M Nguyen
(74) *Attorney, Agent, or Firm* — Campbell Stephenson LLP; Shiv S. Naimpally

(57) ABSTRACT

The present disclosure describes methods and systems that provide for content based dynamic data compression. During a training stage a plurality of training sets are compressed using multiple data compression techniques, and each training data set is associated with a most effective compression technique. Statistical features can be extracted from each of the training data sets with consideration of the most effective compression techniques and are saved as a compression parameters file. During a working stage, individual data blocks within a telemetry data set are compressed using a data compression technique selected for the data block in light of the statistical feature presented in the compression parameters file, and the compressed data blocks are written to a compressed data set, along with encoding tags that identify the compression technique used on each data block. During a consumption stage, the compressed data blocks are decompressed using techniques identified by the encoding tags.

20 Claims, 16 Drawing Sheets

(56) References Cited

OTHER PUBLICATIONS

Shukla, Rahul et al., "Image Compression Through DCT and Huffman Coding Technique," The International Journal of Current Engineering and Technology, vol. 5, No. 3, Jun. 2015, pp. 1942-1946.

"Baum-Welch Algorithm," Wlkipedia, https://en.wikipedia.org/wiki/Baum%E2%80%93Welch_algorithm, (downloaded Dec. 5, 2018), 8 pages.

Yi, Kwan, "Text Classification Using a Hidden Markov Model," Graduate School of Library and Information Studies, McGill University, Jan. 2005, 194 pages.

Yi, Kwan, et al. "A Hidden Markov Model-Based Text Classification of Medical Documents," Journal of Information Science, 35 (1) 2009, pp. 67-81.

Zhai, Jidong, et al., "CYPRESS: Combining Static and Dynamic Analysis for Top-Down Communication Trace Compression," SC14: International Conference for High Performance Computing, Networking, Storage and Analysis, IEEE, 2014, pp. 143-153.

\* cited by examiner

```
{"EventHubUrl":"https://pla-qaext-scu-sb-ns-ingest-
01.servicebus.windows.net/pla-qaext-scu-evthub-
ingest-01/publishers/0084571/messages",
"ApiUrl":"https://qa-external-direct-
tm.plawebsvc01.net/api/v2/direct/",
"Token":"SharedAccessSignature sr=sb%3a%2f%2fpla-
qaext-scu-sb-ns-ingest-
01.servicebus.windows.net%2fpla-qaext-scu-evthub-
ingest-
01%2fPublishers%2f0084571&sig=bC8LGUovqUYHZZN
xRZOCtgzClb4yfXOAjkRhcQ13Xso%3d&se=153258204
3&skn=RootManageSharedAccessKey",
"ExpirationUTC":"07/26/2018 05:14:03",
"EventJson":"{\"SN\":\"0084571\",\"ST\":\"0084571\
",\"MFR\":\"Dell Inc.\",\"PN\":\"Inspiron 7573\"},\
"FormFactor\":\"Unknown\",\"GeoId\":\"244\",\
"LOB\":\"Inspiron\",\"Fusion Locale\":\"en-US\",\
"OCD\":\"05/18/2018 09:04:25\",\"AppKey\":\
"E1F8221B-06B1-4653-8CC3-86BD2246186A\",\
"DAID\":\"0f94ebb1-c4f7-48b4-bd7e-76f532ec9caa\
",\"AppVersion\":\"1.0.128.9\",\"TS\":\"2018-07-26
04:59:01.863\",\"ET\":\"Application Started\",\"EV\":\
"Manual\",\"OSVer\":\"10.0.17134.165\",\"OSSku\":\
"48\",\"LC\":\"en\"}",
"Entropy":"0a21be2b9d06b8b48ec38ab1a52f6dcf071
87a2285cdd69ea20640a215b8e342",
"SerialNumber":"0084571"}
```

FIG. 3A

```
H4sIAAAAAAAAEAJ1SXU/bMBR9n7T/
UEWCJ5zEjpO4IfrQT+gGIDUtYqgvtuO2WYMTYqeFIf77
XKf7AN4mRZFyz73nnnNuXpzRTkh9UbNFITsdZ6N1qTq
eV+YUPFLxplHiNVAMSAUyuRZKAx+6SIS7jAtWK3efybT
YK1cK/
W5l7PSmZn+nvLJmeaY2oIKe7xMcxtB7EEpRgztnnz85v
TJ7K+KRAkMmKklzkGaV4BroB9ds2QumdtwlOWylZebt
kNc0eJZpXmyFNETJhlYi7XFu1iTZWlJdV6KIqq5iJwE9QS
vz/I/TD2PvvZqGmz9uzcfR76nK1l02lJfni2L3uPh+cX9//
TS7nw70+udgwvDz6m7a+7Gdbfg3GNyp4iRIT5XowjBA
IUE+Dk7VVnZnRaGvqDS5/
evvq3i23kdPZVZRnRVyMR+YDPzYQ5GHfEhaftiBuOMH
Td/
h7l9UccjpZekk10uns3SOQpfOmSnNP5SuxjNbG4o8b00
kd231ppmdSGVWF7IVh3FggXFRPYwp10VIGxZyK4u9t
NC5KCaprSKMbeVy2n9D0zDUyjhpXRac5sLCQoJFYrHp
YNglDD1Ijg7bHR93UGjxXImaUGzLCl4JQrAP/
KgPAY7CAJDBwLyi/
hAhHEES9ezMsDc5kq7aWDAGAcerGGDCMGBpLEAcrc
w1BG9zSn9vuTVHzg6CzRx0fRci4rYtOE8ai0Yb8GOAopa
RFxqR0CVRk9GoSdnQ5Bm3d2sImIZapA18a2Fz75rmje
3E7Gt2+YdlMQywC6PwCCbb2oKYNKkOjqktndfm7lJXR
fl8+DMogkwg1k79iBmDRPCAUAZpiFZRyld+DEIMESIhT
9OoLSjyl3wYChkRAUaWLhFVRvPr+oGJ6sDZ/CzO6y/
mTJ4UWQQAAA==
```

FIG. 3B

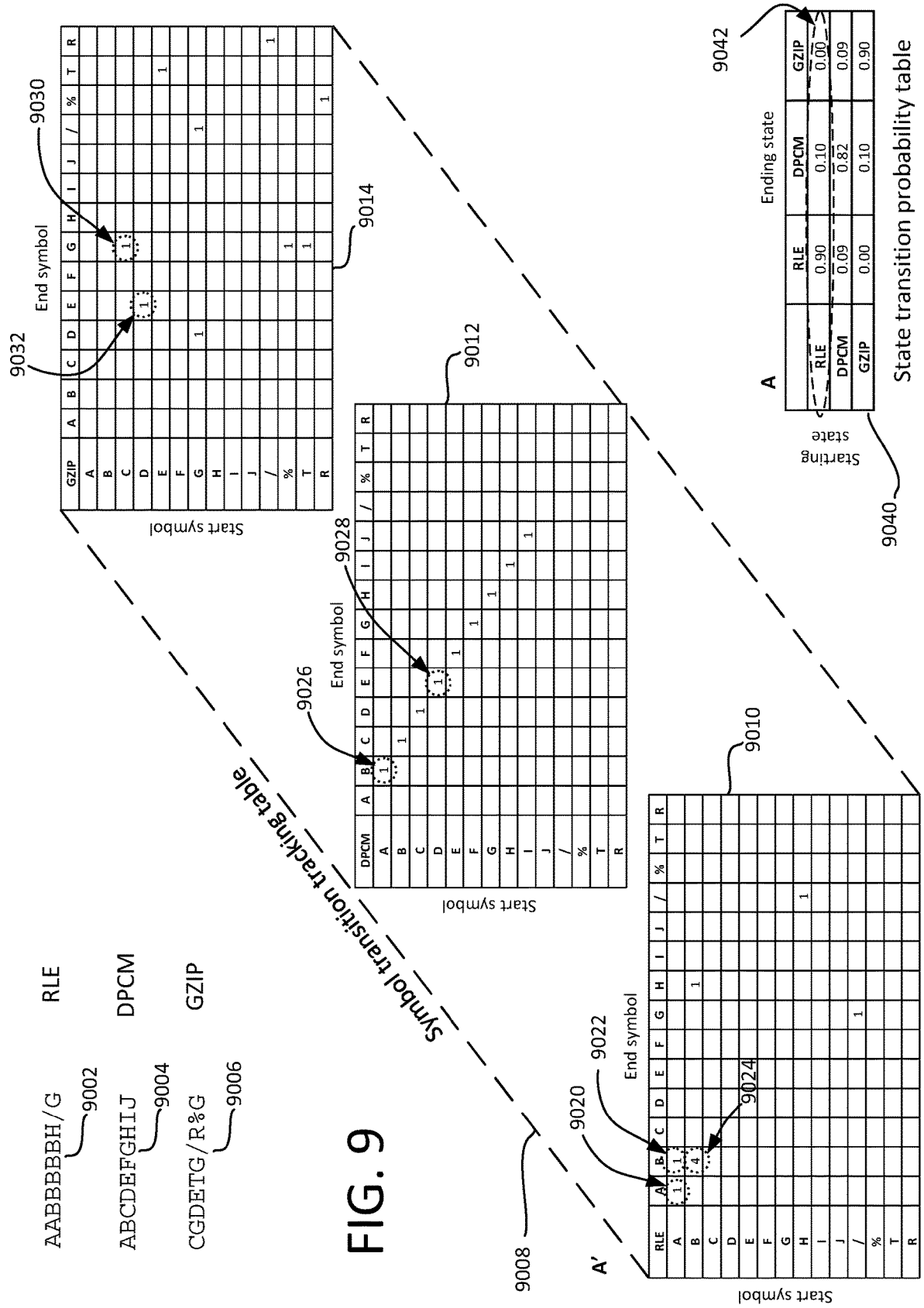

FIG. 10B

Initial state distribution table

| π | RLE | DPCM | GZIP |
|---|---|---|---|
| Init. Prob. | 0.33 | 0.33 | 0.33 |

- 10020 → GZIP 0.33
- 10016 → DPCM 0.33
- 10012 → RLE 0.33
- 10024 → Init. Prob.

FIG. 10A

Observation probability table

| B | Compression technique | | |
|---|---|---|---|
| | RLE | DPCM | GZIP |
| A | 0.67 | 0.33 | 0.00 |
| B | 0.83 | 0.17 | 0.00 |
| C | 0.00 | 0.50 | 0.50 |
| D | 0.00 | 0.50 | 0.50 |
| E | 0.00 | 0.50 | 0.50 |
| F | 0.00 | 1.00 | 0.00 |
| G | 0.00 | 0.33 | 0.67 |
| H | 0.50 | 0.50 | 0.00 |
| I | 0.00 | 1.00 | 0.00 |
| J | 0.00 | 1.00 | 0.00 |
| / | 0.50 | 0.00 | 0.50 |
| % | 0.00 | 0.00 | 1.00 |
| T | 0.00 | 0.00 | 1.00 |
| R | 0.00 | 0.00 | 1.00 |

Start symbol

- 10002 — Observation probability table
- 10004, 10008

METHOD AND SYSTEM OF CONTENT BASED DYNAMIC DATA COMPRESSION

BACKGROUND

The present disclosure relates to the fields of data compression and/or system management, more specifically, a method and system of content based dynamic data compression.

A data set may be compressed before transmission across one or more networks. Data compression generally reduces the size of the data set and may therefore also reduce the transmission time and the amount of network bandwidth that is used. As a non-limiting example, the data set may be a data file created by an application program.

Data compression generally works by reading one or more uncompressed symbols from an uncompressed data set and encoding the one or more uncompressed symbols into one or more compressed symbols in a compressed data set. The compressed data set may be smaller in terms of the total number of bits required to store the compressed data set in comparison to the total number of bits required to store the uncompressed data set.

The compressed data set may be decoded to reproduce the uncompressed data set. If the decoding results in a perfect reproduction of the uncompressed data set, then the compression technique is said to be 'lossless'. If the decoding results in a non-perfect reproduction of the uncompressed data set, then the compression technique is said to be 'lossy'. As a non-limiting example, lossy compression may be desirable if the imperfections introduced by compression are acceptable and result in an additional size reduction. The JPEG standard used to compress images is an example of a lossy compression technique where some loss of image quality may be unnoticeable and lossy compression may result in a smaller compressed data set.

The one or more compressed symbols in the compressed data set may represent an individual uncompressed symbol or one or more control symbols. As non-limiting examples, the one or more control symbols may be a dictionary reference or a decoder instruction. The dictionary reference may point to an entry in a dictionary that is built during the compression process, during the decompression process, or both. As non-limiting examples, the dictionary may track the individual uncompressed symbols and/or sequences of such symbols that have appeared earlier in the uncompressed data set. The individual uncompressed symbols and/or sequences of such symbols appearing in the dictionary may then be represented in the compressed data set by the dictionary reference.

The decoder instruction may be a direction for the decoder. As non-limiting examples, the decoder instruction may direct the decoder to repeat a symbol for a number of occurrences, to insert a symbol that is located at a specific offset from a reference symbol, to change the reference symbol, to reset the dictionary and start building it over again, to place a symbol into the dictionary, or to mark the end of the data set.

In terms of the number of bits used, the one or more compressed symbols used in the compressed data set may be smaller than the individual uncompressed symbols that they replace, may be the same size as the individual uncompressed symbols, may be larger than the individual uncompressed symbols, or may be variable width. It may seem counterintuitive that the one or more compressed symbols may be larger than the individual uncompressed symbols, however an overall reduction in size may result from the one or more compressed symbols replacing a sequence of the individual uncompressed symbols which is longer in length than the one or more compressed symbols that they are replaced by. Where variable length symbols are used, the compression algorithm may rely on the fact that the length of symbols is tracked and determined in the same away by both compression encoder and the compression decoder such that both change the symbol length at the same point in the data stream.

Data compression techniques are known in the art. Non-limiting examples include Run Length Encoding (RLE), which is a form of lossless encoding where sequences of repeating symbols in the uncompressed data set are replaced by an individual control symbol and the individual uncompressed symbol in the compressed data set. As a non-limiting example, using RLE a sequence of 37 repetitions of the symbol '$' may be replaced by the individual control symbol meaning 'repeat the follow symbol 37 times' followed by the individual uncompressed symbol '$'.

Differential Pulse Code Modulation (DPCM) is a form of lossless encoding where each subsequent symbol in the uncompressed data set is compared to a reference symbol and a distance between their code points is encoded into the uncompressed data set if it is below a distance threshold. DPCM takes advantage of the fact that the symbols in the uncompressed data set may cluster within localized portions of a data space and therefore the distance between the reference symbol and the individual uncompressed symbol may be represented using fewer bits than it would take to represent the individual uncompressed symbol. As a non-limiting example, the distance between their code points may be the difference obtained by subtracting one code point from the other code point. The distance may be a signed value and may therefore select a next symbol that is within a range of symbols established by the reference symbol. If the distance is greater than the distance threshold, then the reference symbol may be changed using the one or more control symbols to establish a new range. The reference symbol may remain constant until the distance threshold would be exceeded or the reference symbol may be adjusted after each of individual compressed symbols is produced, in an attempt to bring the reference symbol to the center of the range. As a non-limiting example, using DPCM the sequence 'ABBECCADWYAG" may be replaced by 'A1142203W2A6' where the letters 'A' and 'W' represent the individual uncompressed symbols from the uncompressed data set and the digits '0', '1', 2', '3', 4, and '6' represent the individual control symbols specifying the distance to the next symbol from the reference symbol that appeared that was most recently established. The letters 'A', and 'W' appear in the compressed data set to establish the reference symbol, either initially or because the distance to the next uncompressed symbol exceeds the distance threshold. The digits '0', '1', 2', '3', 4, and '6' in this non-limiting example can be represented using only 4 bits, for an offset of +7 to −8, versus 8 bits or 16 bits required to represent the individual uncompressed symbol.

Lempel, Ziv, Welch (LZW) is a lossless compression algorithm that builds a dictionary that tracks sequences of symbols. As symbols are read from the uncompressed data set any identical sequence of symbols that is already in the dictionary is found up to the point where the dictionary pattern and the input pattern diverge. At that point, a code representing the matching portion of the pattern is passed to the compressed data set and the divergent symbol is added to the dictionary as an extension of the pattern that preceded it. LZW may be implemented using variable length codes to allow the dictionary to grow until the individual control symbol to reset the dictionary and start over is placed into the compressed data set. Under LZW, the decoder builds the same dictionary that the encode built as the compressed data set is produced and is therefore able to interpret the symbols in the compressed data set that represent sequences.

Huffman code is an optimal, variable-length prefix code that is commonly used for lossless compression. In a prefix code, no whole code word is a prefix for any of the other code words. During Huffman coding, a tree is constructed based upon the frequency of occurrence of each symbol such that the least commonly occurring symbols are deepest in the tree. The symbols are then replaced with codes such that the bits in the code represent the path through the tree from the root node to the node representing the symbol. The most commonly occurring symbols have the shortest paths and therefore the shortest codes.

GZIP refers to one of a number of implementations of file compression and decompression based upon Lempel-Ziv and Huffman codes. Like LZW, GZIP is effective at identifying previously occurring sequences of arbitrary length and encoding one or more uncompressed symbols as individual control symbols that reference previously observed sequences.

Throughout this document, the terms 'code' and 'symbol' may be used interchangeably to refer to a value that appears in a data set. Throughout this document, the terms 'data set' and 'data file' may be used interchangeably to refer to a collection of codes or symbols.

SUMMARY

In embodiments, the method and system of content based dynamic data compression (hereinafter also referred to as the present disclosure) may operate in several stages:

a training stage where a set of statistical features 13050 may be extracted from a plurality of training data sets 2060 and saved as a compression parameters file 2070.

an installation stage where the compression parameters file 2070 and the data compressor may be installed on a managed computer system.

a working stage where the telemetry data set 2050 may be compressed such that an individual data block selected from one or more data blocks within the telemetry data set 2050 is compressed using an individual data compression technique that is optimally selected for the individual data block and one or more compressed data blocks are encoded into the compressed telemetry data set 2055. The selection of the individual data compression technique for the individual data block may be determined by an analysis that utilizes the set of statistical features 13050. The compressed telemetry data set 2055 may comprise data that has been compressed using a plurality of data compression techniques which are not necessarily the same.

a transmission stage where the compressed telemetry data set 2055 may be transmitted to the central computer. Note that the transmission stage may be optional if the compressed telemetry data set 2055 is to be consumed on the same system where it was created.

a consumption stage where the central computer may decode the compressed telemetry data set 2055 to reclaim the telemetry data as it originally existed on the managed computer system. The consumption stage may involve separating the compressed telemetry data set 2055 into the one or more compressed data blocks, decompressing each of the one or more compressed data blocks, and writing the resulting uncompressed data into a copy of the telemetry data set 2050.

These stages may be performed on multiple computer systems and at different times. As non-limiting examples, the multiple computer systems may be designated by their role such as a software developer workstation, software lab test system, management console, management server, managed client, managed server, software distribution server, or database server. There is no requirement that any particular stage must be performed on any specific system and, under certain circumstances, two or more of the stages may be performed on a single computer system. In some embodiments, the training stage may be performed on a computer within a software development organization and that the working stage may be performed on a managed computer system, possibly at a distant location and not associated with the development organization.

As a non-limiting example, the following scenario may give a better idea of how the stages are related to each other and where they may be performed:

the training stage may be performed on a software developer's workstation where the plurality of training data sets 2060 are available. The compression parameters file 2070 resulting from the training stage may be sent to a database server for inclusion into a system management software product.

the installation stage may be performed by a software distribution system and may result in the system management software product, including the compression parameters file 2070 and the data compressor, being installed onto a managed computer system.

the working stage may be performed on the managed computer system and may result in the compressed telemetry data set 2055 being created on the managed computer system.

the transmission stage may be performed by centralized management software on a management console or management server that is in communication with the system management software product on the managed system and may result in the compressed telemetry data set 2055 being sent to the management console or management server.

the consumption stage may be performed by centralized management software on the management console or management server resulting in the telemetry data set 2050 being reclaimed for further analysis, reporting, alerting, or other functions of the centralized management software.

An object of the present disclosure is to provide a training stage during which statistical features are acquired from a plurality of training data sets and saved as a compression parameters file.

Another object of the present disclosure is to provide a working stage during which a telemetry data set is compressed such that individual data blocks within the telemetry data set may be compressed using different compression techniques chosen based upon statistical features provided in a compression parameters file.

A further object of the present disclosure is to create a compressed data set where compressed data blocks within the compressed data set provide a compressed data payload and an encode tag indicating which compression technique was used to compress the payload.

Yet another object of the present disclosure is to provide a consumption stage during which compressed data blocks within a compressed data file are decompressed using the compression technique indicated by an encoding tag associated with a data payload.

These together with additional objects, features and advantages of the method and system of content based dynamic data compression will be readily apparent to those of ordinary skill in the art upon reading the following detailed description of the presently preferred, but nonetheless illustrative, embodiments when taken in conjunction with the accompanying drawings.

In this respect, before explaining the current embodiments of the method and system of content based dynamic data compression in detail, it is to be understood that the method and system of content based dynamic data compression is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the method and system of content based dynamic data compression.

It is therefore important that the claims be regarded as including such equivalent construction insofar as they do not depart from the spirit and scope of the method and system of content based dynamic data compression. It is also to be understood that the phraseology and terminology employed herein are for purposes of description and should not be regarded as limiting.

BRIEF DESCRIPTION OF THE DRAWINGS

The accompanying drawings, which are included to provide a further understanding of the present disclosure are incorporated in and constitute a part of this specification, illustrate an embodiments of the present disclosure and together with the description serve to explain the principles of the present disclosure. They are meant to be exemplary illustrations provided to enable persons skilled in the art to practice the disclosure and are not intended to limit the scope of the appended claims.

FIG. 3A illustrates example telemetry data that has been written to a telemetry data set.

FIG. 3B illustrates example telemetry data after compression.

FIG. 9 illustrates an example construction of A' and A matrices.

FIG. 10A illustrates an example construction of a B matrix.

FIG. 10B illustrates an example construction of a Pi matrix.

DETAILED DESCRIPTION

The following detailed description is merely exemplary in nature and is not intended to limit the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description. As used herein, the word "or" is intended to be inclusive.

A data compression technique such as RLE described above can be selected in advance such that a specific application program always invokes the same data compression technique for a particular class of data sets that the application program is preparing for transmission over the network. In addition, the data compression technique can be applied to an entire data set. As non-limiting examples, the application program may apply RLE compression to a pixel-based image data set and LZW to a different data set comprising a textual document. This may not be lead to the most effective use of the compression techniques.

Figure 1:
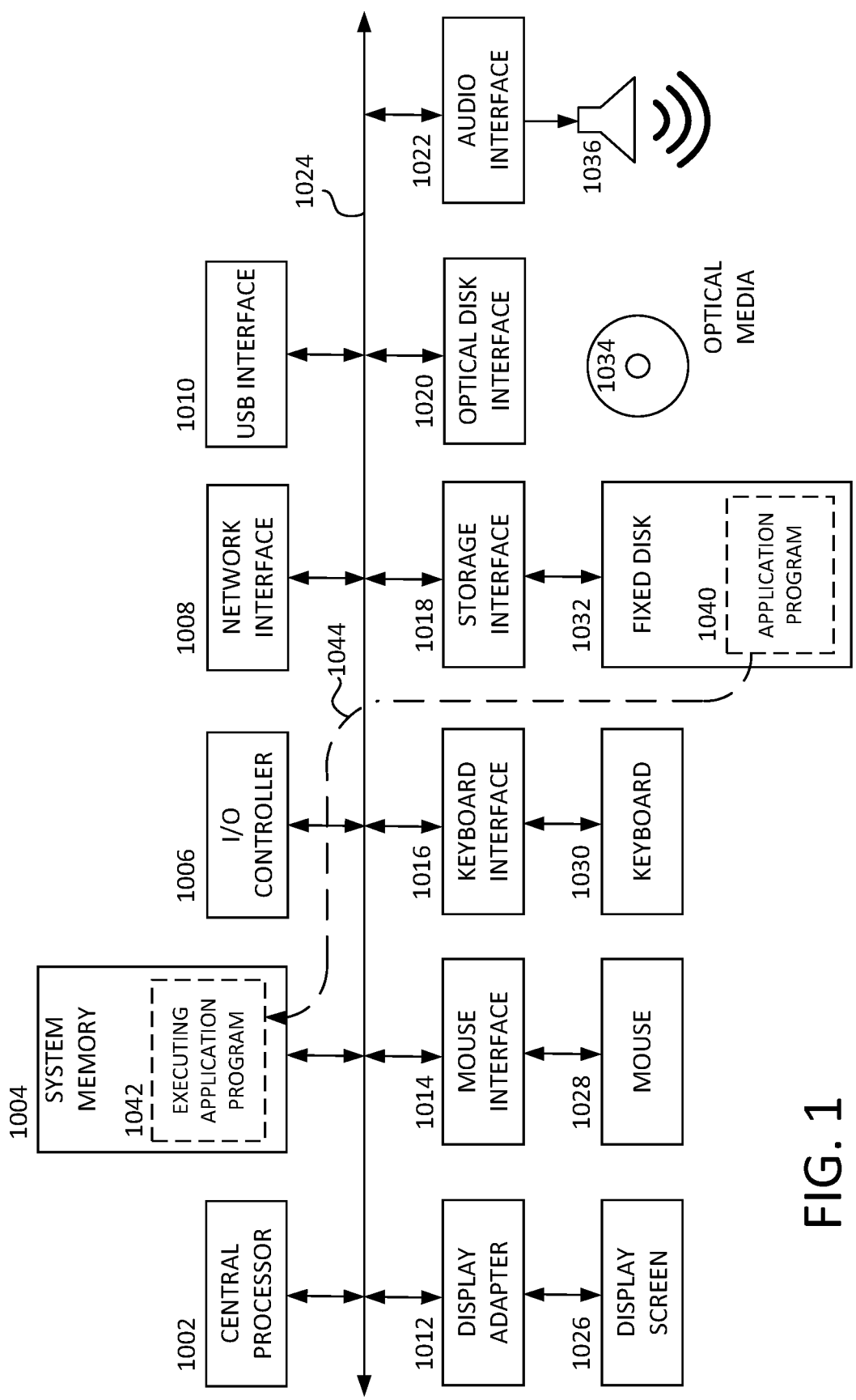
FIG. 1 illustrates an example of a computer system suitable for executing software that implements a training stage, an installation stage, a working stage, a transmission stage, or a consumption stage of the present disclosure.
Figure 2:
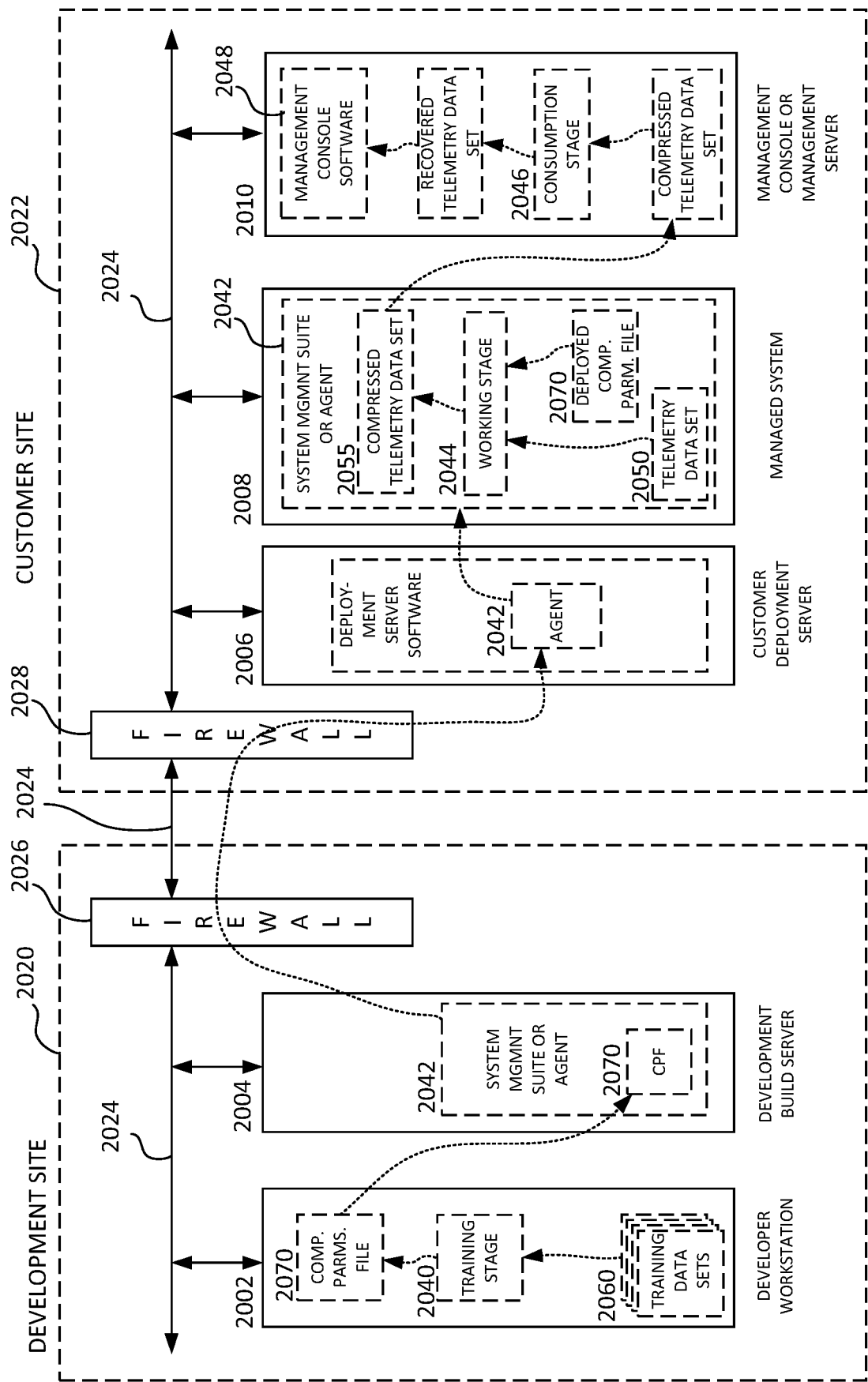
FIG. 2 illustrates an example of multiple computer systems in a network environment.

Detailed reference will now be made to a one or more potential embodiments of the disclosure, which are illustrated in FIGS. 1 through 16. The management of one or more computer systems over one or more networks 2024, as illustrated in FIG. 2, may require the collection of telemetry data from the one or more computer systems and the transmission of the telemetry data to a central computer. As a non-limiting example, the telemetry data may chronicle the state of one or more subsystems of a computer system. It may be advantageous to compress a telemetry data set 2050 that comprises the telemetry data by passing the telemetry data set 2050 through a data compressor before transmitting a compressed telemetry data set 2055 to the central computer in order to save time, bandwidth, and storage space.

However well a data compression technique works, the present disclosure recognizes that it may be possible to produce compressed data sets that are even smaller by recognizing that an uncompressed data set may comprise two or more portions that compress most effectively using different data compression techniques, and therefore the data compressor of the present disclosure may optimize the size of a compressed data set by dynamically selecting two or more compression techniques for use on the uncompressed data set based upon features of the uncompressed data set.

SUMMARY OF THE STAGES

In embodiments, the method and system of content based dynamic data compression (hereinafter present disclosure) may operate in several stages:

a training stage where a set of statistical features 13050 may be extracted from a plurality of training data sets 2060 and saved as a compression parameters file 2070.

an installation stage where the compression parameters file 2070 and a data compressor may be installed on a managed computer system, and which can compress telemetry data or other data in accordance with one or more embodiments of the present disclosure.

a working stage where the telemetry data set 2050 may be compressed such that an individual data block selected from one or more data blocks within the telemetry data set 2050 is compressed using an individual data compression technique that is optimally selected for the individual data block, and one or more compressed data blocks are encoded into the compressed telemetry data set 2055. The selection of the individual data compression technique for the individual data block may be determined by an analysis that utilizes the set of statistical features 13050. The compressed telemetry data set 2055 may comprise data that has been compressed using a plurality of data compression techniques which are not necessarily the same.

a transmission stage where the compressed telemetry data set 2055 may be transmitted to the central computer. Note that the transmission stage may be optional if the compressed telemetry data set 2055 is to be consumed on the same system where it was created.

a consumption stage where the central computer may decode the compressed telemetry data set 2055 to reclaim the telemetry data as it originally existed on the managed computer system. The consumption stage may involve separating the compressed telemetry data set 2055 into the one or more compressed data blocks, decompressing each of the one or more compressed data blocks, and writing the resulting uncompressed data into a copy of the telemetry data set 2050.

These stages may be performed on multiple computer systems and at different times. As non-limiting examples, the multiple computer systems may be designated by their role such as a software developer workstation, software lab test system, management console, management server, managed client, managed server, software distribution server, or database server. There is no requirement that any particular stage must be performed on any specific system and, under certain circumstances, two or more of the stages may be performed on a single computer system. In some embodiments, the training stage may be performed on a computer within a software development organization and that the working stage may be performed on a managed computer system, possibly at a distant location and not associated with the development organization.

As a non-limiting example, the following scenario may give a better idea of how the stages are related to each other and where they may be performed:

the training stage may be performed on a software developer's workstation where the plurality of training data sets 2060 are available. The compression parameters file 2070 resulting from the training stage may be sent to a database server for inclusion into a system management software product.

the installation stage may be performed by a software distribution system and may result in the system management software product, including the compression parameters file 2070 (generated in accordance with one or more embodiments of the present disclosure) and the data compressor (that operates according to one or more embodiments of the present disclosure, being installed onto a managed computer system.

the working stage may be performed on the managed computer system and may result in the compressed telemetry data set 2055 being created on the managed computer system.

the transmission stage may be performed by centralized management software on a management console or management server that is in communication with the system management software product on the managed system and may result in the compressed telemetry data set 2055 being sent to the management console or management server.

the consumption stage may be performed by centralized management software on the management console or management server resulting in the telemetry data set 2050 being reclaimed for further analysis, reporting, alerting, or other functions of the centralized management software.

Training Stage

The goal of a training stage may be to create a compression parameters file 2070 that captures a set of statistical features 13050 of a plurality of training data sets 2060. The plurality of training data sets 2060 may be selected to be representative of expected telemetry data sets 2050 that will be compressed during a working stage. As non-limiting examples, to be representative of the expected telemetry data sets 2050 that may be compressed during the working stage, the plurality of training data sets 2060 may include telemetry data from all of the subsystems of a computer system and may be collected on as many different types or models of computer system as may be encountered during the working stage.

Figure 4:
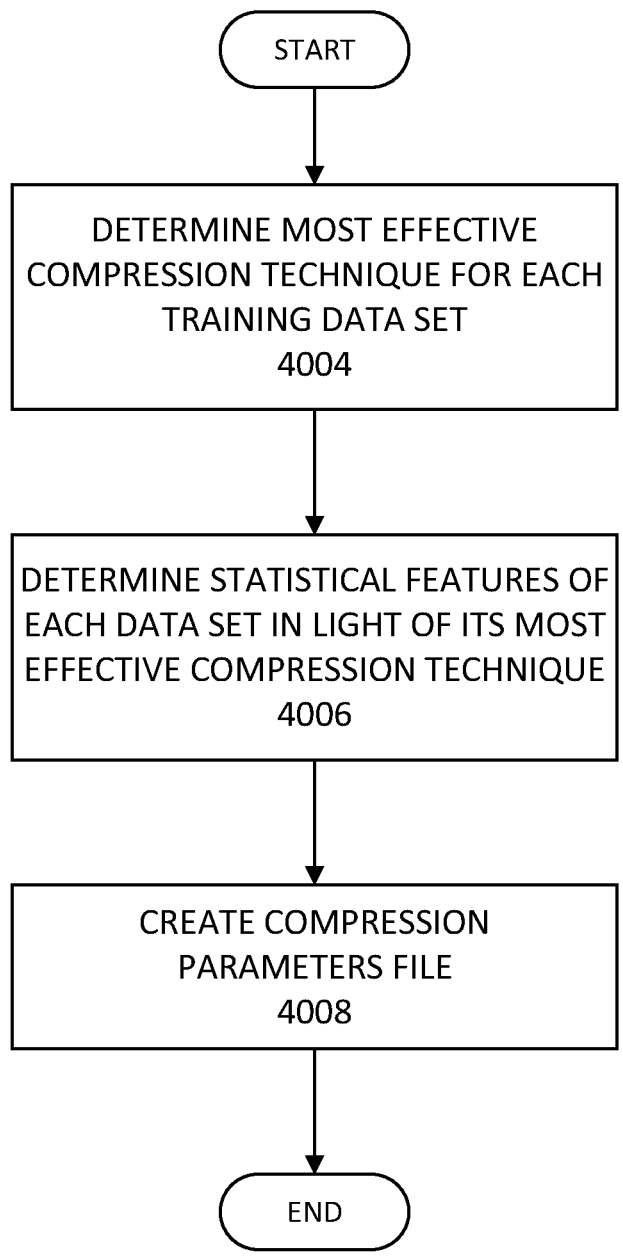
FIG. 4 is a flow diagram depicting relevant aspects of an example process that performs a training stage.
Figure 5:
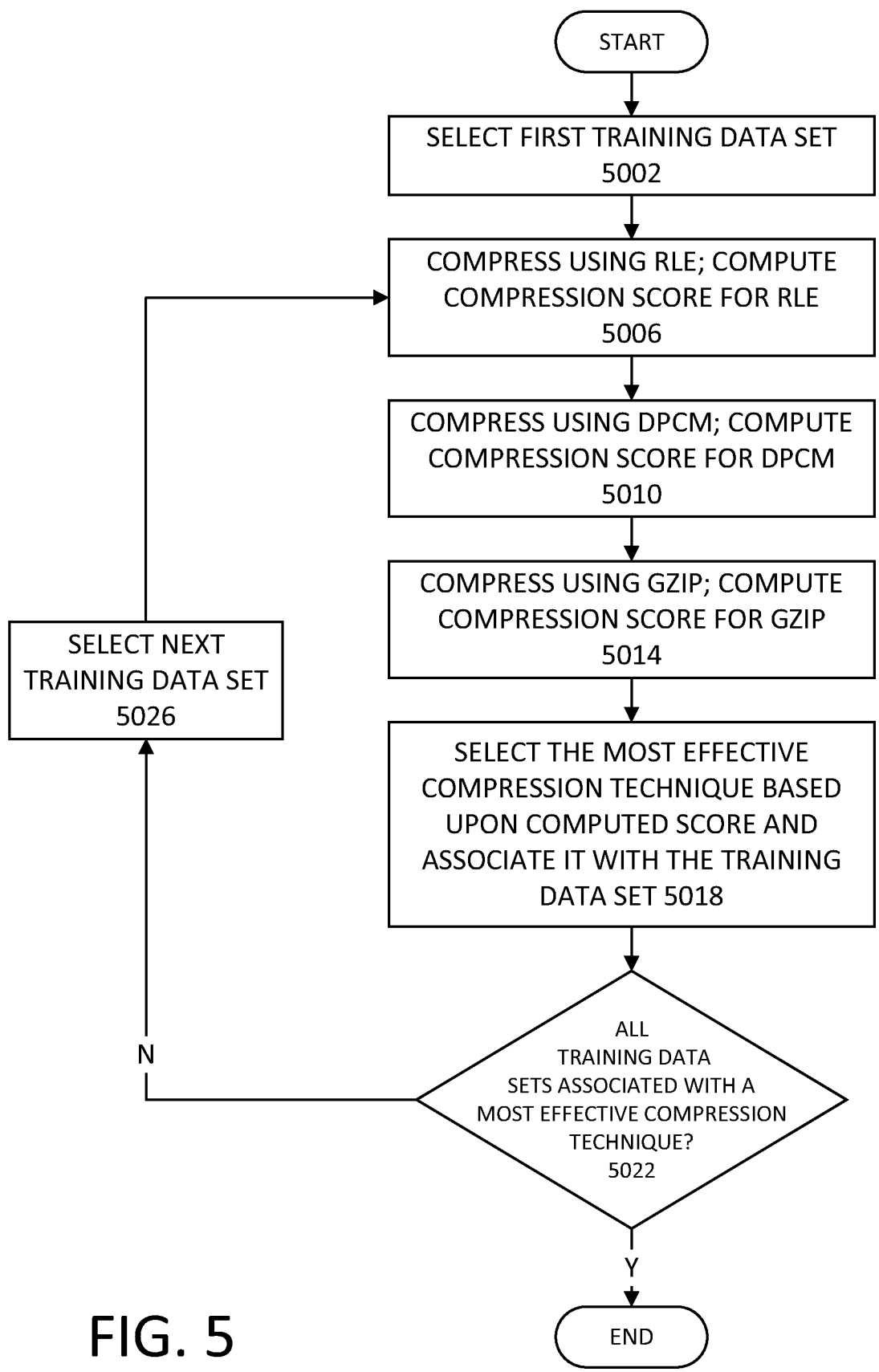
FIG. 5 is a flow diagram relevant aspects of an example process that determines the most effective compression technique for a plurality of training data sets.

The training stage proceeds in two steps: analysis of the compression ratios and determination of statistical features. FIG. 4 provides an overview of the training stage processing. FIG. 5 provides details of the analysis of the compression ratios. FIGS. 6, 7, 8, 9, 10A, and 10B provide details of the determination of statistical features. A detailed explanation of each figure appears later in this document.

Analysis of the Compression Ratios

A most effective compression technique may be associated with each of the plurality of training data sets 2060. To do this, an individual training data set may be selected from the plurality of training data sets 2060 and each of a plurality of data compression techniques may be used to compress the individual training data set. A compression score may be computed based upon an uncompressed data set size relative to a compressed data set size. As a non-limiting example, the compression score may be computed by dividing the compressed data set size by the uncompressed data set size and multiplying by 100.

In this non-limiting example, the compression score would be computed as 100 for a data set that has a compressed size that is the same as its uncompressed size, meaning that the data set does not compress at all. The compression score would be 10 for a data set that compresses to ¹⁄₁₀ of its original size. Therefore, the smaller the compression score is, the more effective the data compression scheme is.

As each of the plurality of data compression techniques is used to compress the individual training data set, the compression score for individual data compression techniques is tracked. When the plurality of data compression techniques have each compressed the individual training data set individually, the individual data compression technique that achieved the best score is associated with the individual training data set as the most effective compression technique for the individual training data set. As a non-limiting example, the association between the individual training data set and the compression score may be stored in a data table until the end of the training stage. During the next step in the training stage, the individual training data sets selected from the plurality of training data sets 2060 may be compressed using only the most effective compression technique associated with the individual training data set while the set of statistical features 13050 are collected.

Determination of Statistical Features

The set of statistical features 13050 are collected from the plurality of training data sets 2060 during the training stage for use during the working stage. The set of statistical features 13050 capture information regarding textual context of the plurality of training data sets 2060. As non-limiting examples, textual context may include a definition of a data space defining the symbols appearing in the plurality of training data sets 2060, counts of transitions between two consecutive symbols, probabilities of the transitions between two consecutive symbols, the probabilities that a specific compression technique is used for specific transitions, probabilities of specific initial conditions, or combinations thereof. The set of statistical features 13050 may be written into the compression parameters file 2070 which may be delivered for use during the working stage. In some embodiments, the compression parameters file 2070 may become a part of another deliverable such as a system management application or system management suite.

In some embodiments, the analysis to determine the set of statistical features 13050 may include a Hidden Markov Model. This model is appropriate for statistically modeling a system where an output of the system, such as a sequence of symbols produced during data compression, are visible but the specific state changes that produce the output, such as the compression algorithm, are not visible. As a non-limiting example, the Hidden Markov model may be defined by a state transition probability matrix designated as A, an observation probability matrix designated as B, and an initial state distribution matrix designated as pi.

The analysis that extracts the statistical features may rely upon the Baum-Welch algorithm, which uses the Expectation-Maximization algorithm to find the maximum likelihood estimate of the parameters of a Hidden Markov Model given a set of observed feature vectors.

Installation Stage

The goal of an installation stage is to install the compression parameters file 2070 and working stage software 2044 (i.e., data compressor) onto a managed system where it may be used to compress one or more telemetry files. The compression parameters file 2070 and the working stage software 2044 may be delivered independently, together, as part of a larger system management application or system management suite, or combinations thereof. The process of delivering and installing may involve first placing the compression parameters file 2070 and the working stage software on a deployment server or distribution server from where it may be deployed to individual managed computer systems.

Working Stage

The goal of the working stage is to compress the telemetry data set 2050 so that it may be transmitted over a network and/or stored more efficiently. The working stage software 2044 may be invoked by a portion of a system management application when it is necessary to capture the telemetry data from a managed computer system. The working stage software may read the telemetry data set 2050 and may compress the telemetry data set 2050 to produce a compressed telemetry data set 2055. Specifically, the working stage software may treat the telemetry data set 2050 as one or more data blocks that compress more effectively if different compression techniques may be applied to individual data blocks based upon statistical features of the individual data blocks instead of applying a single data compression technique to the entire data set.

The analysis performed by the working stage software to determine which of the plurality of data compression techniques to apply to an individual data block, may utilize the compression parameters file 2070 created during the training stage. Specifically, the working stage processing may attempt to determine, for each symbol observed in the individual data block, which compression technique used on the plurality of training data sets 2060 was most likely to have been associated with a transition from that observed symbol based upon the set of statistical features 13050 saved in the compression parameters file 2070. At the end of the individual data block, the working stage processing may determine which of the plurality of data compression techniques was most often associated with an observed symbol appearing in the individual data block and may select the individual data compression technique that was used most often to compress the individual data block in its entirety.

The output of the working stage 2044 may be the compressed telemetry data set 2055. The compressed telemetry data set 2055 may include a file header 16002 followed by one or more compressed data blocks. Each compressed data block may include an encoder tag 16020 and a compressed data payload 16022 where the compressed data payload 16022 is a compressed version of the individual data block from the telemetry data set 2050 and the encoder tag 16020 indicates which of the individual data compression techniques was used to compress the compressed data payload 16022.

In some embodiments, the analysis to determine the most effective compression technique to use on the individual data block during the working stage software may include the Viterbi algorithm. The Viterbi algorithm is a dynamic programming algorithm for finding the most likely sequence of hidden states that result in a sequence of observed event.

Figure 11:
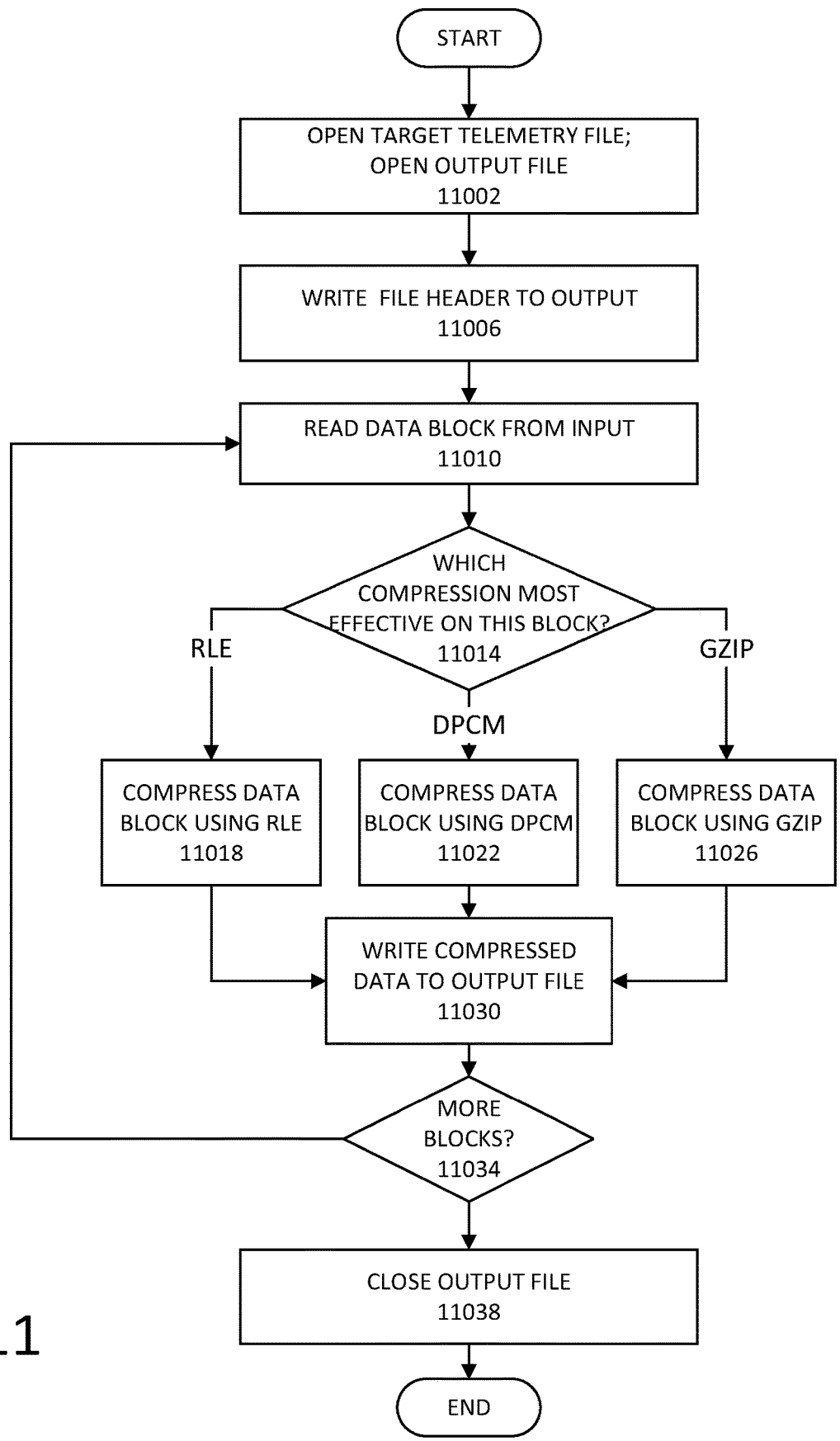
FIG. 11 is a flow diagram depicting relevant aspects of an example process that encodes a target telemetry file into a compressed output file.
Figure 12:
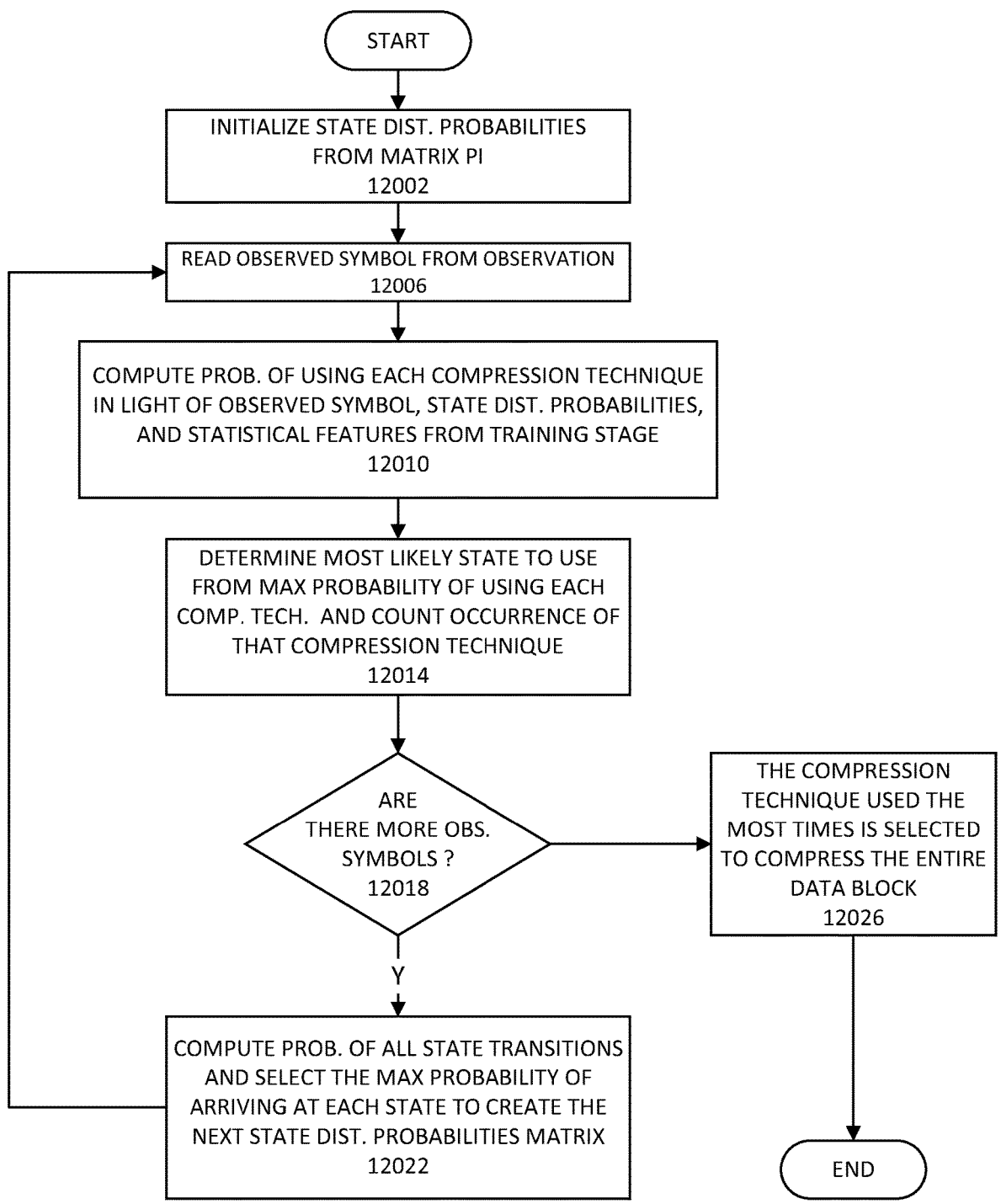
FIG. 12 is a flow diagram depicting a portion of a working stage where a data block from a target data file has been presented for compression.
Figure 13:
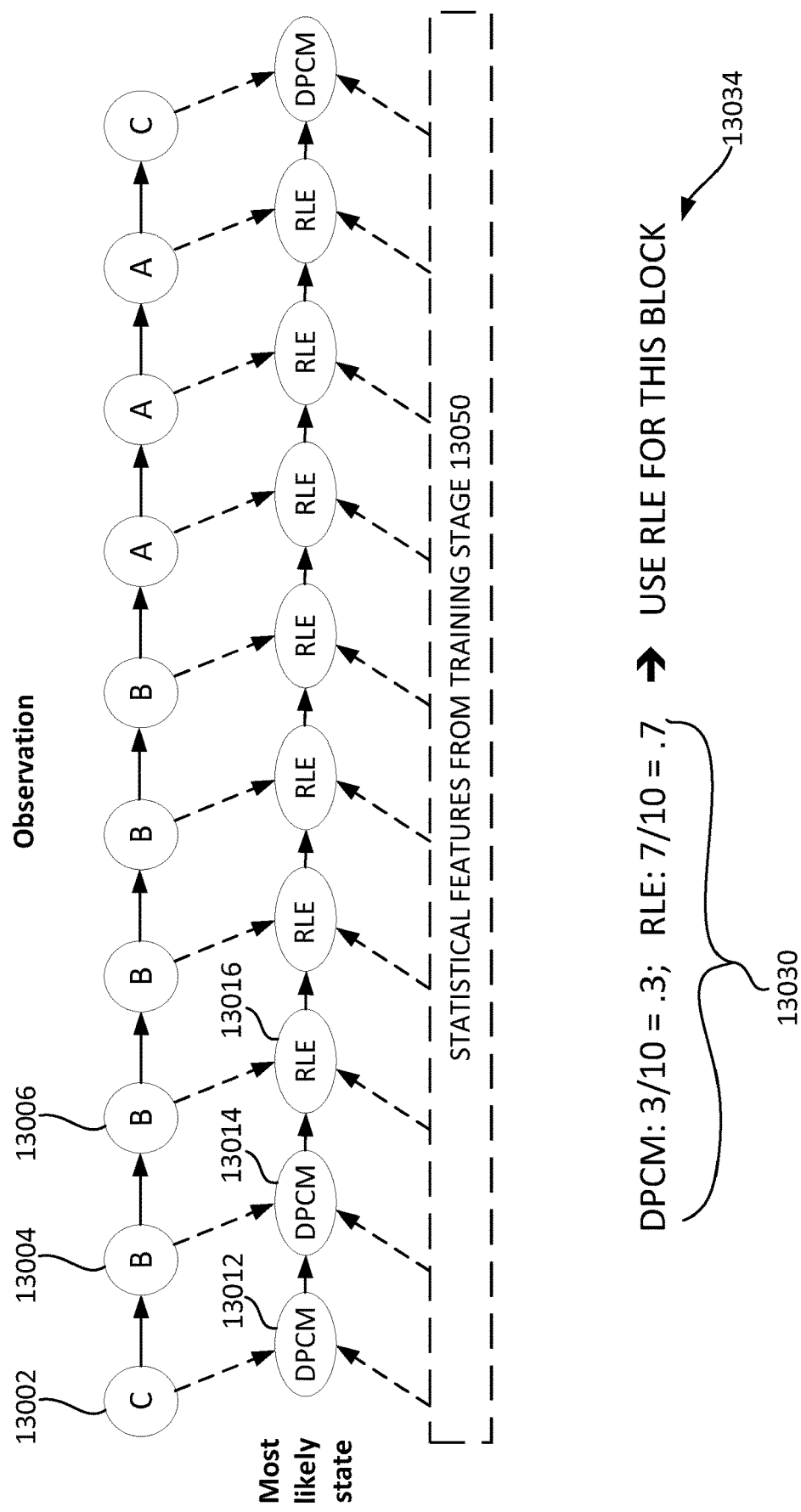
FIG. 13 illustrates a sequence of decisions made during a working stage to determine the most likely compression technique to use on a symbol-by-symbol basis in light of an observation.
Figure 14:
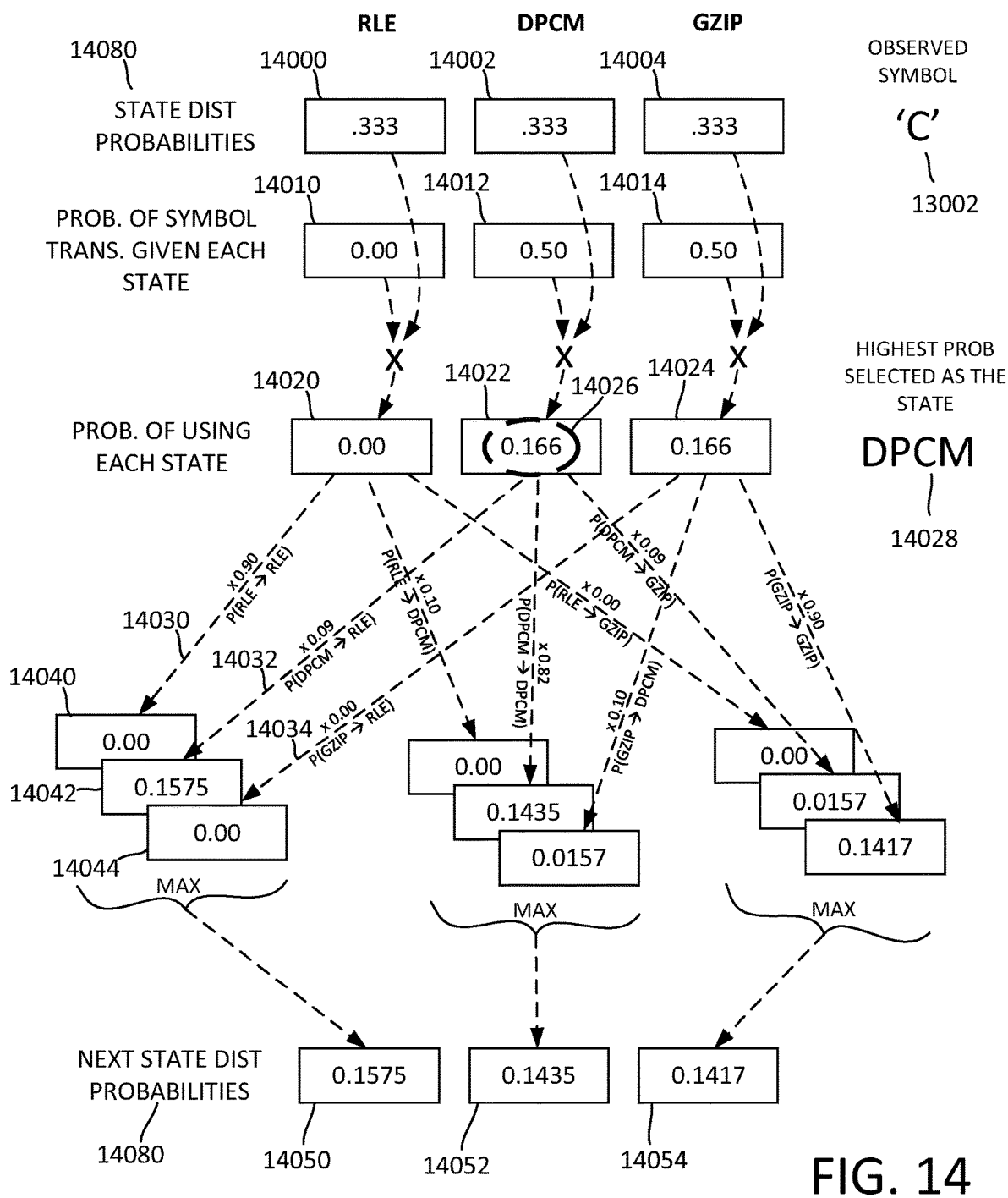
FIG. 14 illustrates the probability computations for one symbol transition during a working stage.
Figure 16:
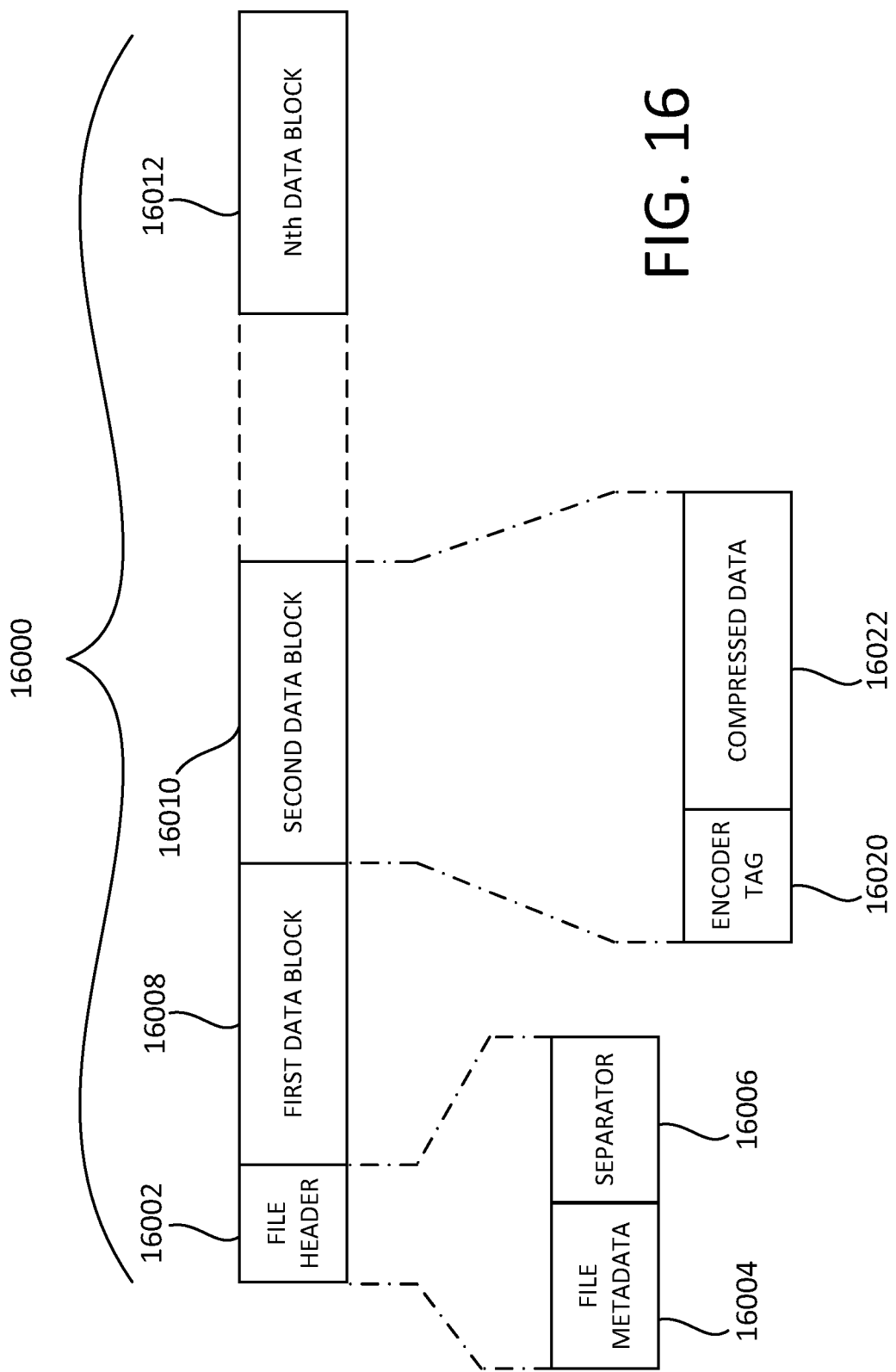
FIG. 16 illustrates a non-limiting example of the structure of a compressed data set according to an embodiment of the present disclosure.

FIG. 11 provides an overview of a non-limiting example of the working stage processing. FIGS. 12, 13, and 14 provide details of a non-limiting example of the analysis that may be used to determine which of the individual data compression techniques to use on the individual data block. FIG. 16 provides details of a non-limiting example of an embodiment of the structure of the compressed telemetry data set 2055. A detailed explanation of each figure appears later in this document.

Transmission Stage

A goal of a transmission stage is to move the compressed telemetry data set 2055 from the managed computer system where it may have been created to a central computer where the telemetry data is needed. In general, this may be accomplished using features of a system management application or system management suite that incorporate the present disclosure. As non-limiting examples, the compressed telemetry data set 2055 may be moved from system to system using wired or wireless networks, serial data connections, a diskette, CD, DVD, or other optical media, a USB key, or combinations thereof. In some embodiments, the working stage software may be incorporated into a system management application such that the distinction between the system management application and the working stage software is irrelevant.

Consumption Stage

The telemetry data may be consumed by an application program after the consumption stage software decompresses the compressed telemetry data set 2055 to restore the telemetry data set 2050 from which the compressed telemetry data set 2055 was created. To do this, the consumption stage software may open the compressed telemetry data set 2055 and decompress the compressed data payload 16022 of each of the compressed data blocks contained within the compressed telemetry data set 2055 by using the decompression techniques corresponding to the compression techniques, respectively, that were used to compress them and by writing the decompressed data blocks to an output file which becomes a copy of the telemetry data set 2050. The consumption stage software may determine which decompression technique to use on the compressed data payload 16022 by reading the encoder tag 16020 associated with the compressed data payload 16022.

Figure 15:
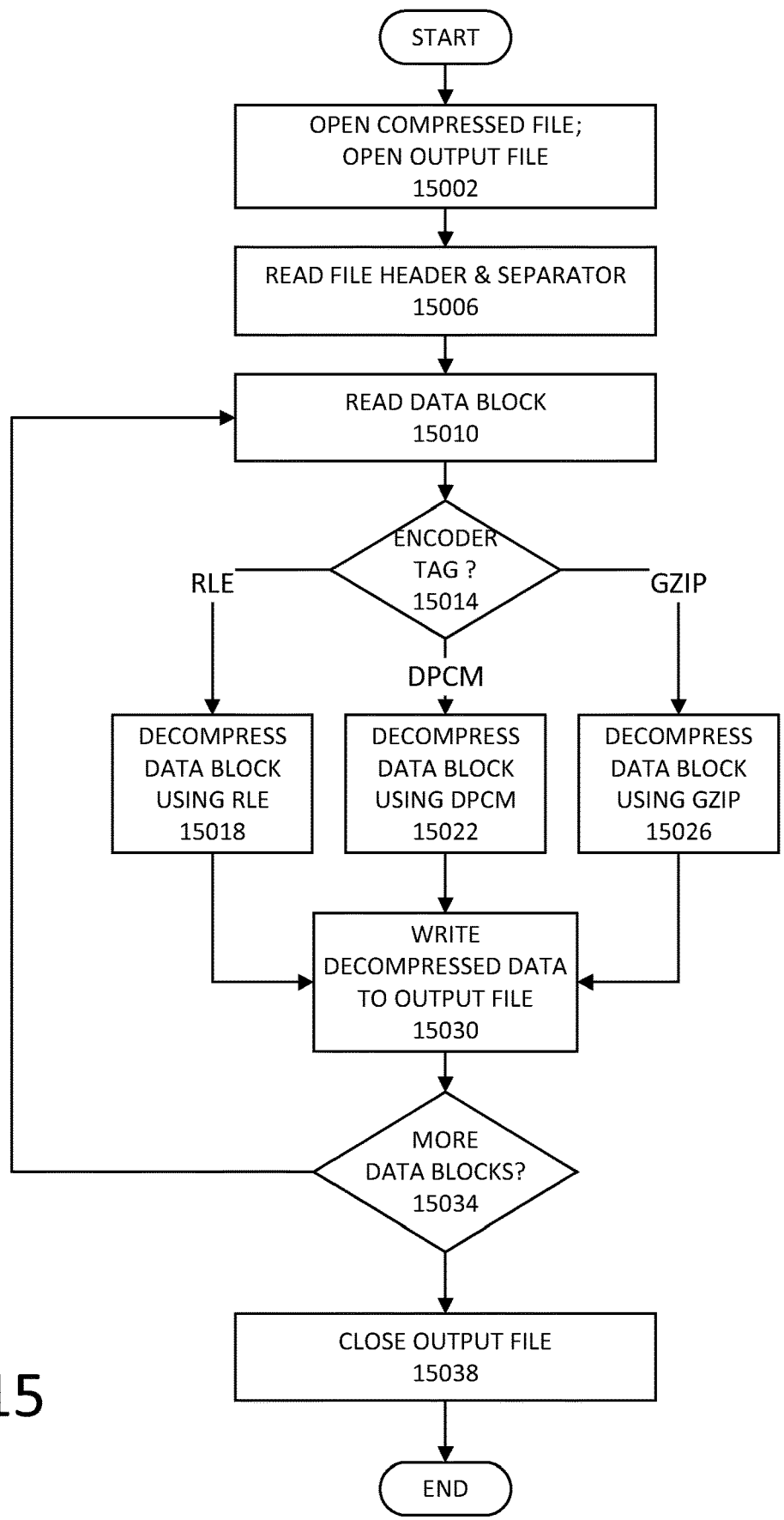
FIG. 15 is a flow diagram depicting a non-limiting example of a process that may decompress a data set.

FIG. 15 provides a non-limiting example of the processing that may be used by consumption stage software to decompress the compressed telemetry data set 2055. FIG. 16 provides details of a non-limiting example of an embodiment of the structure of the compressed telemetry data set 2055. A detailed explanation of each figure appears later in this document.

Small File Variation

When the telemetry data set 2050 is smaller than a predetermined size threshold 358, an embodiment of the present disclosure may use the working stage analysis described herein to determine a most effective compression technique for the entire target telemetry data set 2050 based upon the set of statistical features 13050 collected from the plurality of training data sets 2060 during the training stage, and may compress the telemetry data set 2050 using the individual data compression technique that is suggested.

The name of the individual data compression technique that was used may be written into the "HTTP encode" field of an HTTP header and the compressed telemetry data set 2055 may be transferred to another system using the HTTP protocol. Upon reception of the compressed telemetry data set 2055 by HTTP server, the compressed telemetry data set 2055 may automatically be decompressed using the individual data decompression technique corresponding to that named in the HTTP header.

DETAILED DESCRIPTION OF THE FIGURES

The present disclosure will be described with reference to FIGS. 1-16. FIG. 1 illustrates a non-limiting example of a computer system suitable for executing the software that implements a training stage, an installation stage, a working stage, a transmission stage, or a consumption stage of the present disclosure. In FIG. 1, a processor 1002 may communicate with a system memory 1004, an I/O controller 1006, a network interface 1008, a USB interface 1010, a display adapter 1012, a mouse interface 1014, a keyboard interface 1016, a storage interface 1018, an optical disk interface 1020, and/or an audio interface 1022 over one or more buses 1024. The processor 1002 may display messages and images on a display screen 1026 via the display adapter 1012 and may accept input from a mouse 1028 or a keyboard 1030 via the mouse interface 1014 or the keyboard interface 1016, respectively. The processor 1002 may produce audible sounds through a sound transducer 1036 via the audio interface 1022. The processor 1002 may communicate with other computers on a network via the network interface 1008. The processor 1002 may read or write data to a fixed disk 1032 via the storage interface 1018 or to optical media 1034 via the optical disk interface 1020. An application program 1040 may reside on the fixed disk 1032. The application program 1040 may be moved 1044 from the fixed disk 1032 into the system memory 1004 where it may become an executing application program 1042. The executing application program 1042 may include instruction that cause the processor 1002 to control the sequence and timing of operation of the system memory 1004, the I/O controller 1006, the network interface 1008, the USB interface 1010, the display adapter 1012, the mouse interface 1014, the keyboard interface 1016, the storage interface 1018, the optical disk interface 1020, and/or the audio interface 1022. As non-limiting examples, the executing application program 1042 may cause the processor 1002 to read a plurality of training data sets 2060 and extract a set of statistical features 13050 during the training stage, may cause the processor 1002 to transfer files between systems during the installation stage and during the transmission stage, may cause the processor 1002 to compress a telemetry data set 2050 during the working stage, and may cause the processor 1002 decompress a compressed telemetry data set 2055 during the consumption stage.

FIG. 2 illustrates a non-limiting example of multiple computer systems in a network environment that may play roles in using an embodiment of the present disclosure. In this example, a first computer system 2002 and a second computer system 2004 are located at a first geographic site 2020. The first geographic site 2020 may be the development site of an organization that provides system management software. A third computer system 2006, a fourth computer system 2008, and a fifth computer system 2010 are located at a second geographic site 2022. The second geographic site 2022 may be a customer site where the system management software is deployed and used to manage one or more computer systems. The first computer system 2002, the second computer system 2004, the third computer system 2006, the fourth computer system 2008, and the fifth computer system 2010 may communicate between each other via one or more networks 2024 with restrictions imposed by a first firewall 2026, a second firewall 2028, and security policies in place on the individual systems. Although the first computer system 2002, the second computer system 2004, the third computer system 2006, the fourth computer system 2008, and the fifth computer system 2010 are illustrated as distinct systems, in some embodiments the functions of any of these systems may be moved to and performed by any of the other systems.

The first computer system 2002 may be an individual developer's workstation where the plurality of training data sets 2060 are read by training stage software 2040 to create a compression parameters file 2070. The compression parameters file 2070 may be copied to the second computer system 2004 which may be a development build server, where the compression parameters file 2070 is integrated into a system management agent 2042.

The system management agent 2042 may eventually be delivered, via any one of a number of mechanisms, to the third computer system 2006 at the second geographic site 2022. The third computer system 2006 may be a software deployment server used by a customer to distribute software images to a set of managed systems. The system management agent 2042 may be deployed by installing it onto the fourth computer system 2008. The fourth computer system 2008 may be a workstation, server, or other managed computer in the customer's network. The system management agent 2042 may be requested to provide telemetry data from the fourth computer system 2008. Responsive to such a request, the system management agent 2042 may collect the telemetry data and create the telemetry data set 2050 that includes the telemetry data. Working stage software 2044, which was installed on the fourth computer system 2008 as part of the deployment of the system management agent 2042, may read the telemetry data set 2050 and the compression parameters file 2070 and may compress the telemetry data set 2050 using the methods recited herein to create the compressed telemetry data set 2055, where the compressed telemetry data set 2055 may include one or more compressed data blocks that may have been compressed using a plurality of data compression techniques.

The system management agent 2042 may pass the compressed telemetry data set 2055 to the fifth computer system 2010. The fifth computer system 2010 may be a management console or management server that is responsible for collecting the telemetry data, storing the telemetry data, analyzing the telemetry data, displaying the telemetry data, or combinations thereof. Consumption stage software 2046 installed on the fifth computer system 2010 may read the compressed telemetry data set 2055 and decode the one or more compressed data blocks contained within—applying the appropriate decompression technology to individual data blocks and writing the decompressed data to a reconstruction of the telemetry data set 2050. Once decompressed, the telemetry data contained within the telemetry data set 2050 may be used for system management purposes. As a non-limiting example, the telemetry data may be displayed to a system manager via management console software 2048.

FIG. 3A illustrates telemetry data that has been written to a telemetry data set 2050. FIG. 3B illustrates the telemetry data set 2050 after the entire file is compressed using an individual data compression technique, in this case GZIP. The telemetry data in the files shown in FIG. 3A and in FIG. 3B is the same. The telemetry data within the file of FIG. 3B could be recovered by running the GZIP decompression software on the file shown in FIG. 3B.

FIG. 4 is a flow diagram depicting a non-limiting example of a process that performs a training stage of the present disclosure. At block 4004, a plurality of training data sets 2060 are evaluated to determine a most effective compression technique. Details of how this may be performed appear in FIG. 5. At block 4006, a set of statistical features 13050 of the plurality of training data sets 2060 are determined, in light of the most effective compression technique for each individual training data set. Details of how this may be performed appear in FIGS. 6 and 7. At block 4008, the set of statistical features 13050 are written to a compression parameters file 2070, which is made available for use in a working stage.

FIG. 5 is a flow diagram depicting a non-limiting example of a process that may implement block 4004 of FIG. 4—determining a most effective compression technique for each of a plurality of training data sets 2060. At block 5002, an individual training data set is selected from the plurality of training data sets 2060. At block 5006, block 5010, and block 5014, the individual training data set is compressed using each of a plurality of data compression techniques and a compression score is computed for each of the plurality of data compression techniques. Note that in this non-limiting example, three compressions techniques—RLE, DCPM, and GZIP—are being used. If there were more or fewer compression techniques in use, then the number of compressions of the individual training data set and repetitions of computing the compression score would be adjusted accordingly.

At block 5018, the most effective compression technique is selected based upon the compression scores that were computed previously. As a non-limiting example, if a lower score is an indication of a more effective compression and RLE produced the lowest score, then RLE would be associated with the individual training data set. As non-limiting examples, the most effective compression technique may be associated with the individual training data set by editing metadata in a data structure within training stage software 2040 or by creating a lookup table that associates the individual training data set with the most effective compression technique.

At block 5022 a check is performed to see if the most effective compression technique has been determined for all of the plurality of training data sets 2060. If not, flow passes to block 5026 where a different individual training data set is selected for compression and the process resumes at block 5006 using the different individual training data set.

Figure 6:
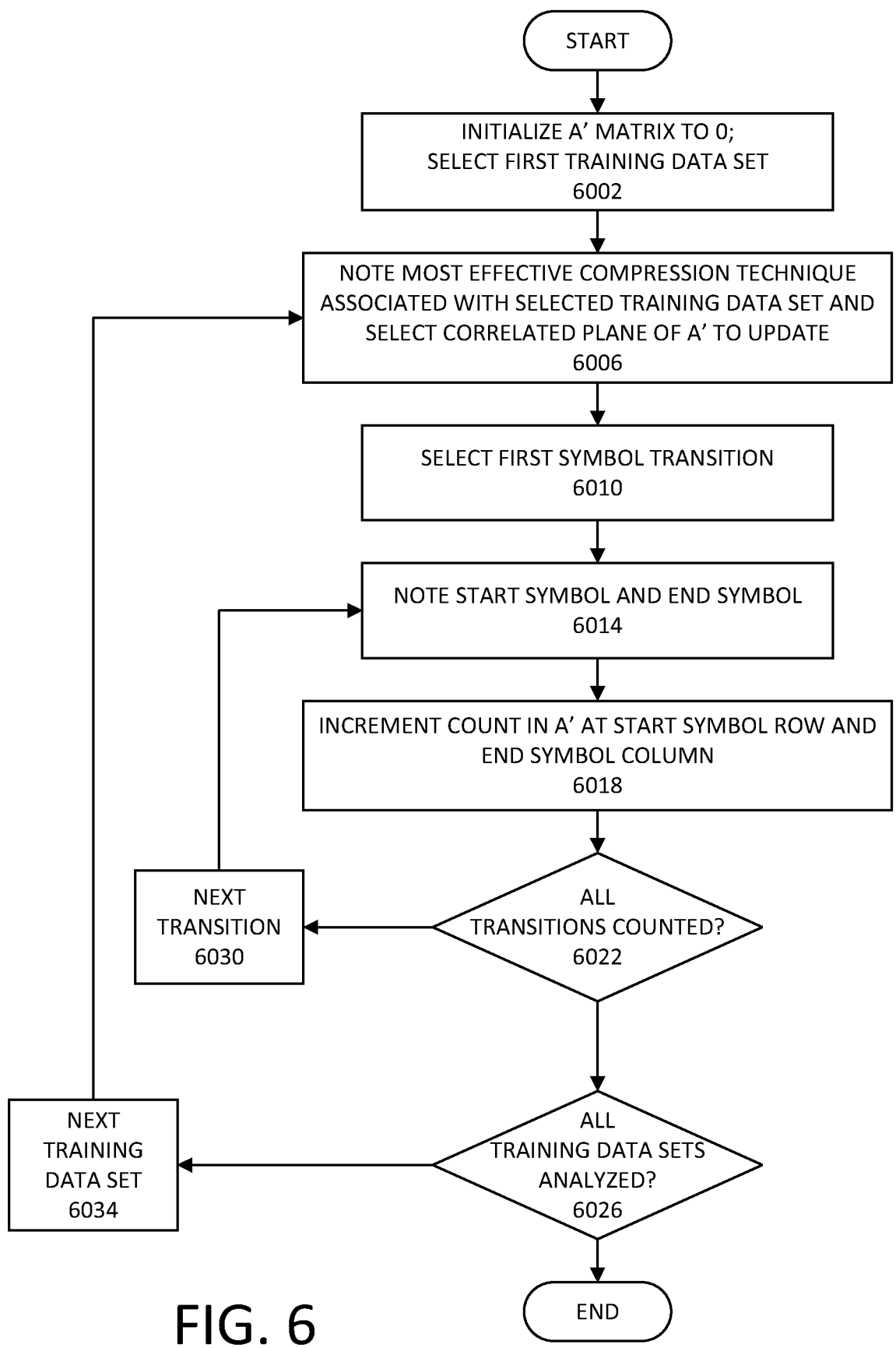
FIG. 6 is a flow diagram relevant aspects of an example process that populates the A' matrix.

FIG. 6 is a flow diagram depicting a non-limiting example of a process that may partially implement block 4006 of FIG. 4—determining a set of statistical features 13050 of each a plurality of training data sets 2060 in light of a most effective compression technique for each of the plurality of training data sets 2060. The continuation and completion of the process may be found in FIG. 7 and FIG. 8. At block 6002, a three-dimensional matrix designated as A' may be created and initialized to zero in every cell. Also in block 6002, one of the plurality of training data sets 2060 is selected for analysis.

The A' matrix may be used to count the occurrences of specific symbol transitions in the plurality of training data sets 2060 under each of a plurality of data compression techniques. An example of matrix A' may be seen in FIG. 9. The three dimensions of matrix A' may be used in the following manner: The symbols appearing vertically up and down the left side of each plane correspond to the starting symbol of a symbol transition in the training data. The symbols appearing horizontally across the top of each plane correspond to the ending symbol of a symbol transition in the training data. The third dimension of the matrix, the individual planes, correspond to the most effective compression technique that was associated with an individual training data set where the symbol transition was seen. As a non-limiting example, if the individual training data set being analyzed is associated with GZIP as the most effective compression technique and the sequence 'TG' appears in the individual training data set, then the cell in the plane for GZIP at the intersection of row 'T' and column 'G' will be incremented.

Continuing with FIG. 6, at block 6006 the most effective compression technique is noted and the corresponding plane of A' is selected for updates. At block 6010, the first symbol transition in the individual training data set is selected for examination. At block 6014, the start symbol and the end symbol of the symbol transition are noted—they will be used to index into a plane of matric A'.

At block 6018, a cell within matric A' is incremented. Specifically, the cell within the plane selected based upon the most effective compression technique at the intersection of the row selected by the start symbol of the transition and the column selected by the end symbol of the transition is incremented to record this particular symbol transition associated with the most effective compression technique of the individual training data set.

At block 6022, a check is made to see if all symbol transitions within the individual training data set have been examined. If not, the exit to block 6030 is taken and the next symbol transition in the individual training data set is selected. The flow then continues to block 6014 where the newly selected symbol transition is examined and counted.

When all symbol transitions in the individual training data set have been examined and counted, the bottom exit from block 6022 is taken to block 6026. At block 6026, a check is made to determine if all of the plurality of training data sets 2060 have been analyzed. If not, the exit to block 6034 is taken and a different individual training data set is selected for analysis. The flow then continues at block 6006 as described above. When all of the plurality of training data sets 2060 have been analyzed, processing continues as shown in FIG. 7.

Figure 7:
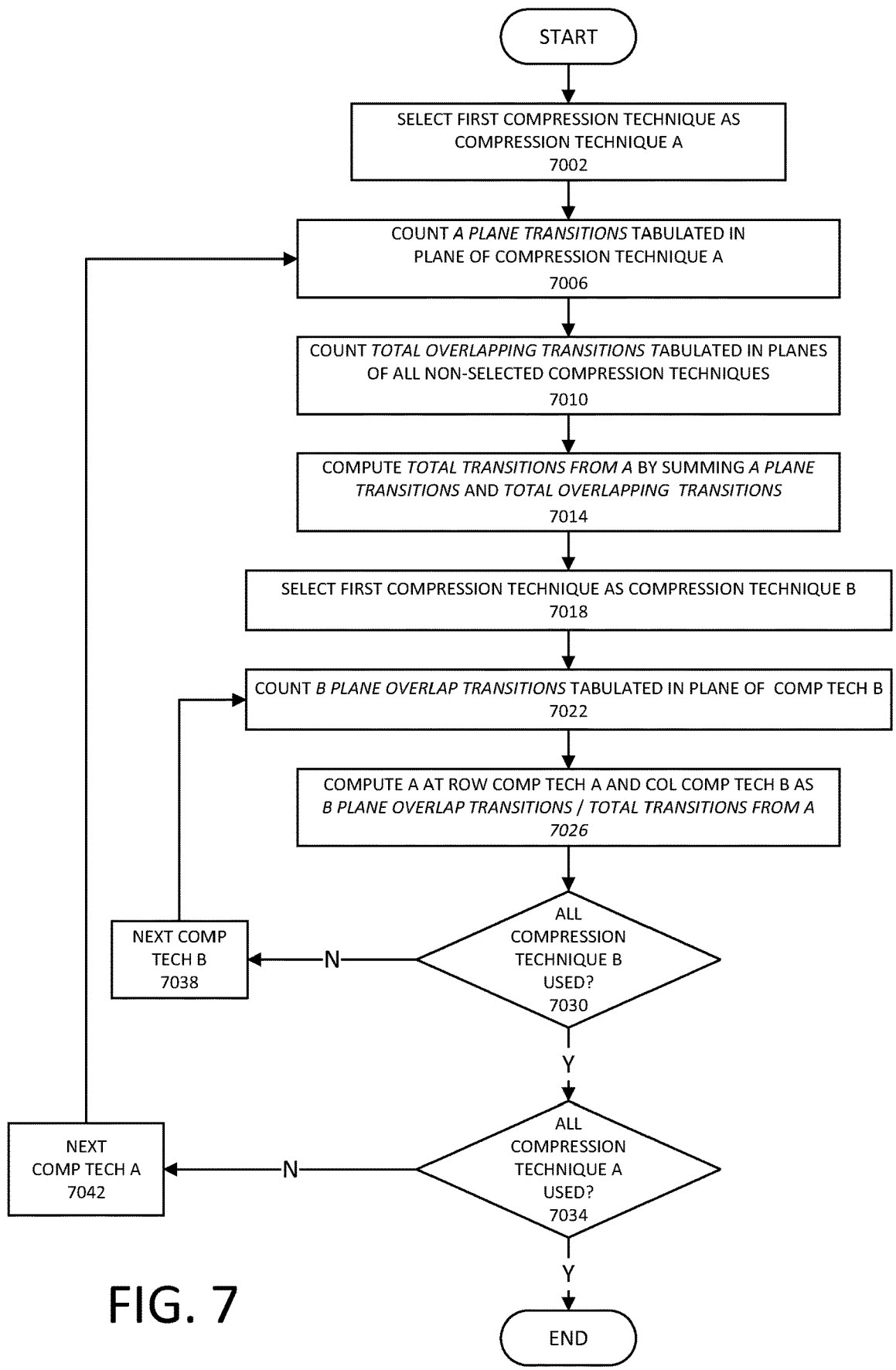
FIG. 7 is a flow diagram depicting relevant aspects of an example process that populates the A matrix.

FIG. 7 is a flow diagram depicting a non-limiting example of a process that may partially implement block 4006 of FIG. 4—determining a set of statistical features 13050 of each a plurality of training data sets 2060 in light of a most effective compression technique for each of the plurality of training data sets 2060. The preceding portion of the process may be found in FIG. 6. The continuation and completion of the process may be found in FIG. 8. During the process shown in FIG. 6, the A' matrix was populated to tabulate the occurrences of specific symbol transitions seen in the plurality of training data sets 2060 and to correlate the count of occurrences with the most effective compression technique associated with an individual training data set where the symbol transitions were seen. In FIG. 7 we may use the data tabulated in matrix A' to create a state transition probability matrix which we designate as matrix A. For this non-limiting example where there are three compression techniques in use, matrix A may be a three by three matrix indexed by an individual data compression technique across both the left side and the top.

The individual data compression technique on the left side may represent a current data compression state and the individual data compression technique across the top may represent a next data compression state. The value at an intersection of a row and column in matrix A may indicate the probability that a state transition from the data compression state shown on the left to the data compression state show across the top. The values in matrix A are computed from data tabulated in matrix A'. An example of matrix A may be seen in FIG. 9.

At block 7002, the individual data compression technique designated as a 'Compression Technique A' is selected from a plurality of data compression techniques. The 'Compression Technique A' corresponds to one of the individual data compression techniques that is shown on the left side of matrix A.

At block 7006, the plane in matrix A' that corresponds to the 'Compression Technique A' is examined and the values in any cell of that plane is summed and designated as 'A Plane Transitions'. The 'A Plane Transitions' represents the number of symbol transitions in the plurality of training data sets 2060 where the transition appeared in a training data set that was most effectively compressed by the 'Compression Technique A'.

At block 7010, a search is made to find cells in planes other than the plane associated with the 'Compression Technique A' where there are non-zero values in both the 'Compression Technique A' plane and the other plane. The values in those cells on the other planes are summed and designated as a 'Total Overlapping Transitions'. The 'Total Overlapping Transitions' represents the number of symbol transitions where a symbol transition may use a data compression technique other than the 'Compression Technique A'.

At block 7014, a 'Total Transitions from A' is computed by adding the 'A Plane Transitions' and the 'Total Overlapping Transitions'. The 'Total Transitions from A' represents the total number of symbol transitions seen in the plurality of training data sets 2060 that involved the 'Compression Technique A' where the transition occurred only when using the 'Compression Technique A' as the most effective compression technique or where the same symbol transition also occurred in a training data set that was most effectively compression using a different compression technique.

At block 7018, a 'Compression Technique B' is selected to be the same data compression technique as the 'Compression Technique A'. The 'Compression Technique B' corresponds to one of the individual data compression techniques that is shown on the top of matrix A.

At block 7022, a 'B Plane Overlap Transitions' is computed by summing all cells in the plane of matrix a' that corresponds to the 'Compression Technique B' only in locations where the plane corresponding to the 'Compression Technique A' has a non-zero value. In the case where the 'Compression Technique A' and the 'Compression Technique B' are the same, the 'B Plane Overlap Transitions' will be the sum of all values in the 'Compression Technique A' plane.

At block 7026, the probability of a state transition from the 'Compression Technique A' to the 'Compression Technique B' is computed by dividing the 'B Plane Overlap Transitions' by the 'Total Transitions from A'. This probability of a state transition from the 'Compression Technique A' to the 'Compression Technique B' is written to matrix A in the cell located at the intersection of the 'Compression Technique A' row and the 'Compression Technique B' column.

At block 7030, a check is made to see if all of the plurality of data compression techniques have been chosen for use as the 'Compression Technique B'. In the event that they have not all been used, an exit to block 7038 is taken and a different compression technique is chosen as the 'Compression Technique B'. Then the flow resumes at block 7022 as described above.

At block 7034, a check is made to see if all of the plurality of data compression techniques have been chosen for use as the 'Compression Technique A'. In the event that they have not all been used, an exit to block 7042 is taken and a different compression technique is chosen as the 'Compression Technique A'. Then the flow resumes at block 7006 as described above.

Figure 8:
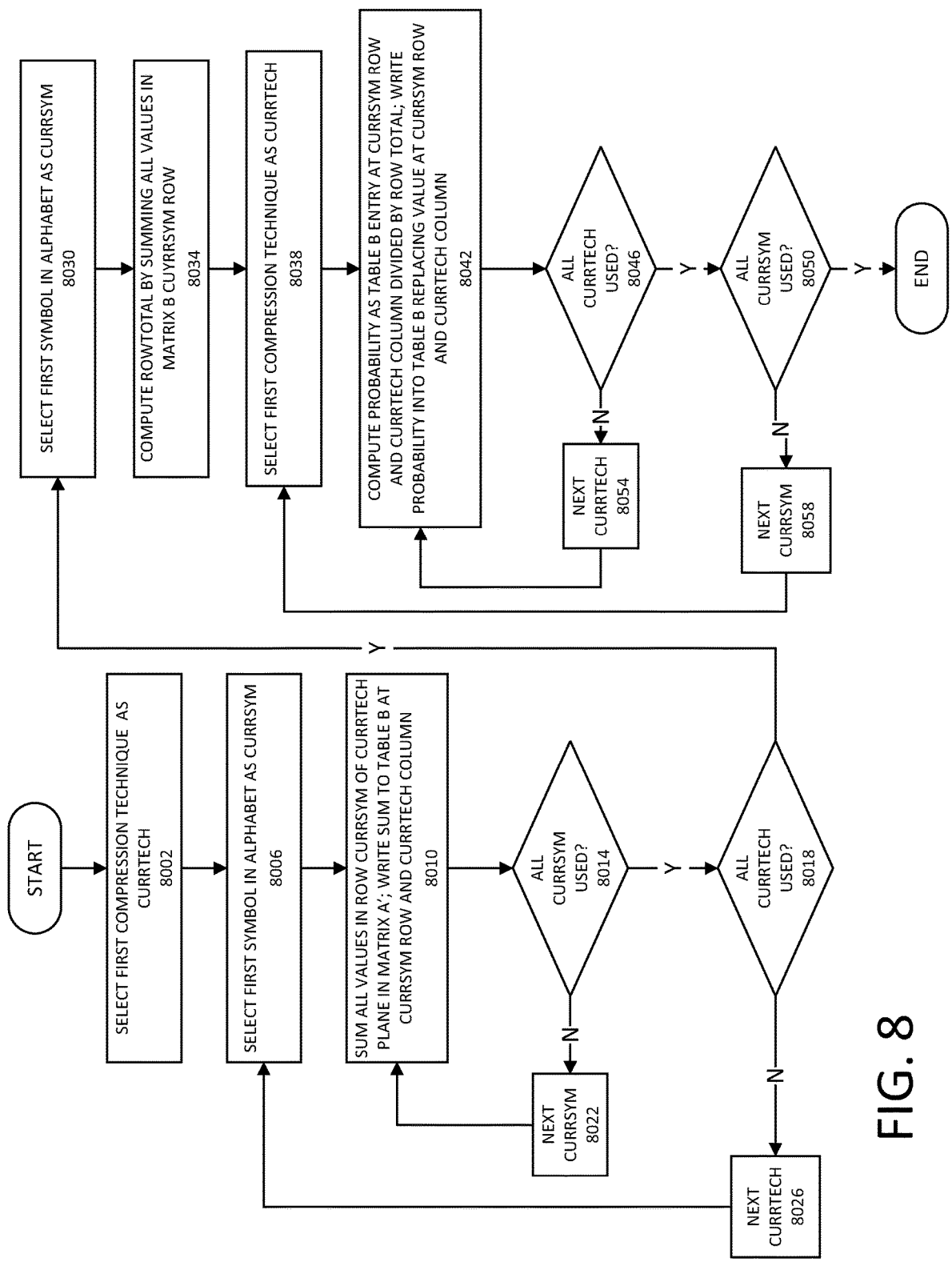
FIG. 8 is a flow diagram depicting relevant aspects of an example process that populates the B matrix.

FIG. 8 is a flow diagram depicting a non-limiting example of a process that may partially implement block 4006 of FIG. 4—determining a set of statistical features 13050 of each a plurality of training data sets 2060 in light of a most effective compression technique for each of the plurality of training data sets 2060. The preceding portions of the process may be found in FIG. 6 and FIG. 7.

The flow diagram in FIG. 8 specifically describes how matrix B (see FIG. 10) may be populated. At block 8002, one of a plurality of data compression techniques is selected and designated as CURRTECH. At block 8006, one of the symbols in the alphabet is selected and designated as CURRSYM.

At block 8010, all values in a row of matrix A' are summed. The specific row that is summed is the CURRSYM row in the plane of matrix A' that corresponds with CUR-RTECH. The sum is temporarily stored in matrix B at the intersection of the CURRSYM row and the CURRTECH column.

At block 8014, a check is performed to see if all of the symbols in the alphabet have been processed. If not, block 8022 selects an unprocessed symbol as CURRSYM and processing continues at block 8010 as described above. After all symbols have been processed, block 8018 performs a check to see if all compression techniques have been processed. If not, block 8026 selects an unprocessed compression technique as CURRTECH and processing continues at block 8006 as described above.

Arriving at block 8030, each cell in matrix B contains a count of how many times in the training data a transition from the start symbol on the left side occurs using the compression technique shown at the top. What is desired in matrix B is a probability of the transition from the symbol, not a count. So, to compute a probability of the transition from the symbol, each value in matrix B must be divided by the count of how many times a transition from the symbol is used across all data compression techniques.

At block 8030, the first symbol in the alphabet is selected as CURRSYM. At block 8034, a ROWTOTAL is computed by summing all values in matrix B at the row corresponding to CURRSYM. This value indicates how many times a transition from CURRSYM occurs under any data compression technique applied to the training data.

At block 8038, a data compression technique is selected and designated as CURRTECH. At block 8042, a PROBABILITY is computed by reading the value in matrix B at the intersection of row CURRSYM and column CURRTECH and dividing that value by ROWTOTAL. The PROBABILITY is then saved in matrix B at the intersection of row CURRSYM and column CURRTECH, overwriting the count that was temporarily stored there.

At block 8046, a check is performed to see if all of the compression techniques have been processed. If not, block 8054 selects an unprocessed compression technique as CURRTECH and processing continues at block 8042 as described above. After all compression techniques have been processed, block 8050 performs a check to see if all symbol in the alphabet have been processed. If not, block 8058 selects an unprocessed symbol as CURRSYM and processing continues at block 8038 as described above.

FIG. 9 illustrates how matrix A' and matrix A are constructed. Matrix A' is also referred to as the 'symbol transition tracking table' and it tabulates the number of specific symbol transitions occurring for data sets that are compressed by a specific compression technique. A process for tabulating the values in A' is illustrated in FIG. 6.

A first data set 9002, a second data set 9004, and a third data set 9006 are shown at the upper left corner of FIG. 9. The size of each data set and the number of data sets have been kept small to simplify the non-limiting example. The first data set 9002 has previously been found to compress most effectively using RLE using techniques. (See the discussion of FIG. 5.) The second data set 9004 has previously been found to compress most effectively using DPCM. The third data set 9006 has previously been found to compress most effectively using GZIP.

Matrix A' 9008 starts initialized to zero counts in every cell. Every symbol transition in each of the data sets must be examined and tabulated in matrix A'. As a non-limiting example, the first data set 9002 is associated with RLE compression so the RLE plane 9010 will be updated when processing the first data set 9002. The first two symbols in the first data set 9002 are 'AA' so cell 9020 in the RLE plane 9010 of matrix A' at the intersection of a starting symbol of 'A' and an ending symbol of 'A' is incremented. Note that the alphabet of symbols appears down the left side and across the top of each plane in matrix A' so that these symbol transitions can be indexed.

The next symbol transition in the first data set 9002 is 'AB' so cell 9022 in the RLE plane 9010 is incremented. The symbol transition 'BB' then appears four times in a row so cell 9024 is incremented four times. The remainder of the first data set 9002 is examined and tabulated in the same way.

The second data set 9004 is associated with DPCM compression so the DPCM plane 9012 will be updated when processing the second data set 9004. The first two symbols in the second data set 9004 are 'AB' so cell 9026 in the DPCM plane 9012 of matrix A' at the intersection of a starting symbol of 'A' and an ending symbol of 'B' is incremented. Note that an 'AB' symbol transition was observed in the first data set 9002 and was counted in the DPCM plane 9012, however since the second data set 9004 is associated with DPCM as the most effective compression technique cell 9026 is incremented instead of cell 9022. The remaining symbol transitions in the second data set 9004 are examined and counted in the DPCM plane 9012 in the same way.

The third data set 9006 is associated with GZIP compression so the GZIP plane 9014 will be updated when processing the third data set 9006. The first two symbols in the third data set 9006 are 'CG' so cell 9030 in the GZIP plane 9014 of matrix A' at the intersection of a starting symbol of 'C' and an ending symbol of 'G' is incremented. The remaining symbol transitions in the third data set 9006 are examined and counted in the GZIP plane 9014 in the same way. Note that the symbol transition 'DE' appears in both the second data set 9004 and in the third data set 9006, so cell 9028 and cell 9032 are both incremented and overlap between planes.

Matrix A is also referred to as the 'state transition probability table' and it tabulates the probability of a transition from one compression technique to another according to the training data. A process for tabulating the values in A is illustrated in FIG. 7. Once matrix A' has been populated using all of the training data, the values in matrix A may be computed. Matrix A gives the probability that the compression technique will change state. As a non-limiting example, for the values shown in matrix A, there is a 90 percent probability that if RLE compression is used for a symbol transition then RLE compression will be used for the next symbol transition. FIG. 7 illustrates a process for computing these values however the details for row 9042, which are transitions starting in the RLE plane 9010, will be explained here:

Note that there are 9 symbol transitions shown in the RLE plane 9010 of matrix A'.

Note that there is 1 symbol transition shown in another plane that overlaps a transition shown in the RLE plane 9010. Specifically, the symbol transition 'AB' appears in both the RLE plane 9010 and in the DPCM plane 9012.

These values indicate that there are a total of 10 symbol transitions that may begin in the RLE plane 9010: 9 end in the RLE plane 9010 and 1 ends in the DPCM plane 9012.

The values in row 9042 can now be computed: 9 out of 10 symbol transitions start in the RLE plane 9010 and end in the RLE plane 9010 for an RLE to RLE probability of 0.90. 1 out of 10 symbol transitions start in the RLE plane 9010 and end in the DPCM plane 9012 for an RLE to DPCM probability of 0.10. 0 out of 10 symbol transitions start in the RLE plane 9010 and end in the GZIP plane 9014 for an RLE to GZIP probability of 0.010. Other rows of matrix B may be computed in the same manner.

FIG. 10A illustrates how matrix B 10002 is constructed. Matrix B 10002 is also referred to as the 'observation probability table' and it tabulates the probability of a compression technique being used after a specific symbol appears in the data according to the training data. A process for tabulating the values in B is illustrated in FIG. 8.

Matrix B 10002 may be tabulated using the values given in matrix A' 9008. Refer to FIG. 9 for values from matrix A' 9008 in the following non-limiting examples.

For row 10004 where the starting symbol is 'A':

Note that there are 2 symbol transitions in the RLE plane 9010 of matrix A' 9008 that start with symbol 'A'.

Note that there is 1 symbol transition in the DPCM plane 9012 of matrix A' 9008 that starts with symbol 'A'.

Note that there are 0 symbol transitions in the DPCM plane 9012 of matrix A' 9008 that start with symbol 'A'.

Of the 3 symbol transitions in matrix A' 9008 that start with symbol 'A', 2 out of 3, or 0.67, are in the RLE plane 9010, 1 out of 3, or 0.33, are in the DPCM plane 9012, and 0 out of 3, or 0.00, are in the GZIP plane 9014. These are the values that populate row 10004.

For row 10008 where the starting symbol is 'B':

Note that there are 5 symbol transitions in the RLE plane 9010 of matrix A' 9008 that start with symbol 'B'.

Note that there is 1 symbol transition in the DPCM plane 9012 of matrix A' 9008 that starts with symbol 'B'.

Note that there are 0 symbol transitions in the DPCM plane 9012 of matrix A' 9008 that start with symbol 'B'.

Of the 6 symbol transitions in matrix A' 9008 that start with symbol 'B', 5 out of 6, or 0.83, are in the RLE plane 9010, 1 out of 6, or 0.17, are in the DPCM plane 9012, and 0 out of 6, or 0.00, are in the GZIP plane 9014. These are the values that populate row 10008. Rows for other starting symbols are computed in the same manner.

FIG. 10B illustrates how matrix pi 10024 is constructed. Matrix pi 10024 is also referred to as the 'initial state distribution table' and it tabulates the probability of a specific compression technique being used initially. Values in matrix pi 10024 are computed at the end of a training stage by calculating what percentage of the training data sets were most effectively compressed by each data compression technique. In this simple non-limiting example, only three training data sets were used and each one compressed most effectively under a different compression technique. Therefore cell 10012 corresponding to RLE is computed to be 1 out of 3 or 0.33, cell 10012 corresponding to DPCM is computed to be 1 out of 3 or 0.33, and cell 10012 corresponding to GZIP is computed to be 1 out of 3 or 0.33.

In a different non-limiting example, where 100 training data sets were used and 33 compressed most effectively using RLE, 45 compressed most effectively using DPCM, and 22 compressed most effectively using GZIP, the values would be cell 10012, cell 10016, and cell 10020 would be 0.33, 0.45, and 0.22, respectively.

FIG. 11 is a flow diagram depicting a non-limiting example of a process that encodes a target telemetry file into a compressed output file. At block 11002, the target telemetry data file is opened and an output file for the compressed data is also opened. At block 11006, the file header is written to the output file. As non-limiting examples, the file header may include metadata regarding the output file and a file separator.

At block 11010, a data block is read from the target file. As non-limiting examples, the data block read may be a line textual characters terminated by a new line character or equivalent, a fixed length block of characters, some other subset of the file, or the entire file.

At block 11014, a determination is made regarding which data compression should be used to compress the data block. The specific of how that determination is made is described using FIGS. 12 through 14. How branches to block 11018, block 11022, or block 11026 based upon the determination of which compression technique to use and the data bock is compressed using RLE at block 11018, using DPCM at block 11022, or using GZIP at block 11026. At block 11030, an encoder tag and the compressed data block is written to the output file. The encoder tag indicates which compression technique was used to compress the data block so that it may be properly decompressed later.

At block 11034, a check is made to determine if there are more data blocks in the target file. If there are more data blocks, flow passes to block 11010 where the next data block is read and the process repeats. If there are not more data blocks, flow passes to block 11038 where the output file is closed.

FIG. 12 is a flow diagram depicting a portion of a working stage where a data block from a target data file has been presented for compression. This figure provides details regarding block 11014 on FIG. 11.

At block 12002, a state distribution probabilities matrix is initialized using data from a set of statistical features 13050, specifically the data in matrix pi 10024. At block 12006, a symbol is observed from the data block of the target data set.

At block 12010, a computation is made to how likely it is that each of the compression techniques will be used after observing the symbol, based upon the set of statistical features 13050 from a training stage. Specifics of this computation appear in FIG. 14. At block 12014, the one compression technique with the highest computed probability is selected as most likely to be used and its use is counted once. At block 12018, a check is performed to see if there are more symbols in the data block. If there are, flow passes to block 12006, the next symbol is read, and the process repeats.

If there are no more symbols in the data block, at block 12026 the compression technique that was selected for use the most times in this data block is selected for use in compressing the entire data block.

If there are more symbols in the data block, at block 12022 the probabilities of all possible state transitions are computed and the state distribution probabilities are updated for the next observation. Specifics of this computation appear in FIG. 14.

FIG. 13 illustrates a sequence of decisions made during a working stage where a set of statistical features 13050 from a training stage, a string of symbols observed in a data block from a target data set, a history of previous state transitions, or combinations thereof are used to determine the most likely compression technique to use on a symbol-by-symbol basis.

A first observed symbol 13002, a 'C', is read from the data block and, in conjunction with the set of statistical features 13050, a determination is made that a first compression state 13012 should be DPCM. The determination is based upon which compression technique was most effective on each of the training data sets, the specific symbol transitions that appeared in the training data sets, initial probabilities resulting from the training stage, and the presentation of the first observed symbol 13002. Specifics of the computation and decision appear in FIG. 14.

A second observed symbol 13004, a 'B', is read from the data block and, in conjunction with the set of statistical features 13050, a determination is made that a second compression state 13014 should again be DPCM. A third observed symbol 13006, another 'B', is read from the data block and, in conjunction with the set of statistical features 13050, a determination is made that a third compression state 13016 should now be RLE.

The process continues until all ten symbols in the data block have been processed and a compression technique has been selected for each. At the end of the block, a summary count 13030 shows that RLE was selected 7 times, DPCM was selected 3 times, and GZIP was not selected. Accordingly, a decision 13034 is made that the entire data block should be compressed using RLE because RLE was selected 70% of the time, vs 30% for DPCM.

FIG. 14 illustrates the manner in which the probabilities are computed for each observed symbol and how the compression technique decision is made during a working stage.

State distribution probabilities 14080 are either initialized from matrix pi 10024 in a set of statistical features 13050 or inherited from a previous stage of symbol processing. 'probability that the previous state was RLE' 14000, 'probability that the previous state was DPCM' 14002, and 'probability that the previous state was GZIP' 14004 in this non-limiting example are all initialized to 0.333 from matrix pi 10024 as was described in the description of FIG. 10B.

A first observed symbol 13002 is read from the data block as a 'C'. From matrix B in the set of statistical features 13050, 'probability of symbol 'C' using RLE' 14010 is 0.00, 'probability of symbol 'C' using DPCM' 14012 is 0.50, and 'probability of symbol 'C' using GZIP' 14014 is 0.50.

Multiplying the 'probability that the previous state was RLE' 14000 by the 'probability of symbol 'C' using RLE' 14010 we compute that 'probability that the current state is RLE' 14020 is 0.00. Multiplying the 'probability that the previous state was DPCM' 14002 by the 'probability of symbol 'C' using DPCM' 14012 we compute that 'probability that the current state is DPCM' 14022 is 0.166. Multiplying the 'probability that the previous state was GZIP' 14004 by the 'probability of symbol 'C' using GZIP' 14014 we compute that 'probability that the current state is GZIP' 14024 is 0.166. Selecting the highest probability 14026 of the three, we conclude that the current state 14028 is DPCM. Note that in this non-limiting example GZIP had the same probability as DPCM so we could have chosen either one, but chose the first one that was calculated.

It is now necessary to compute the probability of all possible state transitions to determine what the state distribution probabilities 14080 will be for the next symbol. Turning to RLE first, multiply the 'probability that the current state is RLE' 14020 by 'probability of a transition from RLE to RLE' 14030 to determine that 'probability that the current state is RLE from RLE' 14040 is 0.00. Multiply the 'probability that the current state is DPCM' 14022 by 'probability of a transition from DPCM to RLE' 14032 to determine that 'probability that the current state is RLE from DPCM' 14042 is 0.1575. Multiply the 'probability that the current state is GZIP' 14024 by 'probability of a transition from GZIP to RLE' 14034 to determine that 'probability that the current state is RLE from GZIP' 14044 is 0.00. Note that the 'probability of a transition from RLE to RLE' 14030, the 'probability of a transition from DPCM to RLE' 14032, and the 'probability of a transition from GZIP to RLE' 14034 are obtained from matrix B 10002 in the set of statistical features 13050. By choosing the maximum value from among the 'probability that the current state is RLE from RLE' 14040, the 'probability that the current state is RLE from DPCM' 14042, and the 'probability that the current state is RLE from GZIP' 14044 we set 'probability that the previous state was RLE for the next round' 14050 to 0.1575. This becomes the 'probability that the previous state was RLE' 14000 (at the top of FIG. 14) when processing the next symbol from the data block.

Similar processing of DPCM and GZIP probabilities, as shown in FIG. 14, result in the 'probability that the previous state was DPCM for the next round' 14052 being calculated as 0.1435 and 'probability that the previous state was GZIP for the next round' 14054 calculated as 0.1417. Next state distribution probabilities 14085 thus computed become the state distribution probabilities 14080 for the processing of the next observed symbol. The processing shown on FIG. 14 is repeated once for each symbol in the data block.

FIG. 15 is a flow diagram depicting an example of a process that may decompress a data set that has been compress by the process of FIG. 11. At block 15002, the compressed data set is opened and an output data set is opened. At block 15006, the file header is read until a separator between the file header and the data blocks in located. At block 15010, a data block is read from the compressed data set.

At block 15014, an encoder tag at the beginning of the data block indicates which of the compression techniques was used to compress the data within this data block. If RLE compression was used, then at block 15018 the remainder of the data block is decoded using RLE decompression. If DPCM compression was used, then at block 15022 the remainder of the data block is decoded using DPCM decompression. If GZIP compression was used, then at block 15026 the remainder of the data block is decoded using GZIP decompression.

At block 15030, the decompressed data is written to the output data set. AT block 15034, a check is made to determine whether there are more data blocks to process in the compressed data set. If there are, flow continues to block 15010 where the next data block is read as described above. If there are no more data blocks to process, at block 15038 the output data set is closed.

FIG. 16 illustrates an example of a compressed data set structure 16000 as produced by an embodiment of the present disclosure. The data set may begin with a file header 16002 which may convey file metadata 16004. As non-limiting examples, the file metadata 16004 may provide the file names, date and time stamps, file size, checksums, or combinations thereof for the original uncompressed data set, the compressed data set, or both. In some embodiments, the file metadata 16004 may indicate the number and size of the data blocks that follow. The end of the file metadata 16004 may be marked by the presence of a separator 16006.

After the separator 16006, the compressed data set structure 16000 may include a first compressed data block 16008. Depending upon the size of the original uncompressed data set, the first compressed data block 16008 may be the only data block provided in the compressed data set. For larger data sets, the compressed data set may include a second compressed data block 16010, or more, eventually reaching a final compressed data block 16012.

As an example, an individual data block may include an encoder tag 16020 followed by a compressed data payload 16022. After selecting a most effective compression technique to use on an uncompressed data block (as described elsewhere in this document), the uncompressed data block may be compressed using the most effective compression technique to form the compressed data payload 16022. The encoder tag 16020 indicate which compression technique was used. As non-limiting examples, if the encoder tag 16020 is '0' it may indicate that the data block was compressed using RLE, '1' may indicate DPCM, and '2' may indicate GZIP.

With respect to the above description, it is to be realized that the optimum dimensional relationship for the various components of the present disclosure described above and in FIGS. 1 through 16, include variations in size, materials, shape, form, function, and manner of operation, assembly and use, are deemed readily apparent and obvious to one skilled in the art, and all equivalent relationships to those illustrated in the drawings and described in the specification are intended to be encompassed by the present disclosure.

It shall be noted that those skilled in the art will readily recognize numerous adaptations and modifications which can be made to the various embodiments of the present disclosure which will result in an improved method or apparatus, yet all of which will fall within the spirit and scope of the present disclosure as defined in the following claims. Accordingly, the present disclosure is to be limited only by the scope of the following claims and their equivalents.

Although the present disclosure has been described in connection with several embodiments, the disclosure is not intended to be limited to the specific forms set forth herein. On the contrary, it is intended to cover such alternatives, modifications, and equivalents as can be reasonably included within the scope of the disclosure as defined by the appended claims.

What is claimed is:

1. A method comprising:
processing a plurality of training data sets, wherein the plurality of training data sets include at least a first training data set and a second training data set, the processing comprising:
compressing the first training data set using a first compression technique of a plurality of compression techniques;
compressing the first training data set using a second compression technique of the plurality of compression techniques;
performing a first comparison of:
compressing the first training data set using the first compression technique, with
compressing the first training data using the second compression technique;
determining, based on the first comparison, that compressing the first training data set using the first compression technique has a smaller size as compared to using the second compression technique;
compressing the second training data set using the first compression technique;
compressing the second training data set using the second compression technique;
performing a second comparison of:
compressing the second training data set using the first compression technique, with
compressing the second training data set the second compression technique;
determining, based on the second comparison, that compressing the second training data set using the second compression technique has a smaller size as compared to using the first compression technique;
associating the first training data set with the first compression technique;
associating the second training data set with the second compression technique;
creating a first table based on the first training data set;
creating a second table based on the second training data set;
creating a first matrix corresponding to the first compression technique, the first matrix comprising first rows and first columns;
creating a second matrix corresponding to the second compression technique, the second matrix comprising second rows and second columns;
wherein at least one of entry in the first matrix and the second matrix corresponds to immediately adjacent symbols in the first and second training data sets; and
sending one or more tables including the first table and the second table to one or more computer systems for use in compressing sets of data stored on each of the one or more computer systems.

2. The method of claim 1, wherein the plurality of compression techniques comprises at least two of:
run length encoding (RLE) compression;
differential pulse code modulation (DPCM) compression;
Lempel, Ziv, Welch (LZW) compression;
Huffman code compression; and
GZIP compression.

3. The method of claim 1 wherein:
the at least one entry of the first matrix includes a total number of instances in which the immediately adjacent symbols occur in the first training data set, and
the at least one entry of the second matrix includes a total number of instances in which the immediately adjacent symbols occur in second training data set.

4. The method of claim 1 wherein the processing comprises:
compressing individual training data sets of the plurality of training data sets using the plurality of compression techniques;
determining a particular technique of the compression techniques that is most effective in producing a small file for compressing an individual training data sets of the plurality of training data sets;
associating the particular technique with the individual training data set; and
generating, for individual training data sets, a particular table based on the particular technique.

5. The method of claim 1 wherein:
at least one of the first and second tables comprises a number of rows that represents a total number of symbols included in the plurality of training data sets;
the number of rows correspond to the symbols;
each row of the number of rows comprises entries corresponding to each of the compression techniques; and
each particular entry in a row represents a probability that two immediately adjacent symbols are included in one or more training data sets of the plurality of training data sets that are mapped to the compression technique that is associated with the particular entry.

6. The method of claim 1 wherein:
at least one table of the one or more tables comprises a single row,
the single row comprising individual entries corresponding to individual ones of the compression techniques, respectively, and
individual entries representing a probability that a first two symbols of one or more training data sets of the plurality of training data sets is included in the one or more training data sets of the plurality of training sets that are associated with the compression technique corresponding to the individual entries.

7. The method according to claim 1, wherein the processing further comprises:
   determining information associated with one or more of:
      a textual context of the plurality of training data sets,
      a list of the plurality of compression techniques,
      a definition of a data space defining symbols appearing in the plurality of training data sets,
      counts of transitions between two consecutive symbols,
      probabilities of the transitions between two consecutive symbols,
      probabilities that a specific compression technique is used to transition between two consecutive symbols, and
      probabilities of initial conditions.

8. The method of claim 1, further comprising:
   reading one or more data blocks from a working data set;
   determining for each particular data block of the one or more data blocks, which particular compression technique of the plurality of compression techniques produces a smallest result when compressing each particular data block;
   compressing each particular data block of the one or more data blocks using the particular compression technique determined to produce the smallest result for each particular data block; and
   writing the compressed data blocks to a storage device to create a compressed data set.

9. A computing device comprising:
   one or more processors; and
   one or more non-transitory computer-readable storage media to store instructions executable by the one or more processors to perform operations comprising:
      determining a plurality of training data sets that include at least a first training data set and a second training data set;
      compressing the first training data set using a first compression technique of a plurality of compression techniques;
      compressing the first training data set using a second compression technique of the plurality of compression techniques;
      performing a first comparison of:
         compressing the first training data set using the first compression technique, with
         compressing the first training data using the second compression technique;
      determining, based on the first comparison, that compressing the first training data set using the first compression technique has a smaller size as compared to using the second compression technique;
      compressing the second training data set using the first compression technique;
      compressing the second training data set using the second compression technique;
      performing a second comparison of:
         compressing the second training data set using the first compression technique, with
         compressing the second training data set the second compression technique;
      determining, based on the second comparison, that compressing the second training data set using the second compression technique has the smaller size as compared to using the first compression technique;
      associating the first training data set with the first compression technique;
      associating the second training data set with the second compression technique;
      creating a first table based on the first training data set;
      creating a second table based on the second training data set;
      creating a first matrix corresponding to the first compression technique, the first matrix comprising first rows and first columns;
      creating a second matrix corresponding to the second compression technique, the second matrix comprising second rows and second columns;
      wherein at least one entry in the first matrix and the second matrix corresponds to immediately adjacent symbols in the first and second training data sets; and
      sending one or more tables including the first table and the second table to one or more computer systems for use in compressing sets of data stored on each of the one or more computer systems.

10. The computing device of claim 9, wherein:
    the at least one entry of the first matrix includes a total number of instances in which the immediately adjacent symbols occur in the first training data set, and
    the at least one entry of the second matrix includes a total number of instances in which the immediately adjacent symbols occur in second training data set.

11. The computing device of claim 9, wherein the operations further comprise:
    compressing individual training data sets of the plurality of training data sets using the plurality of compression techniques;
    determining a particular technique of the compression techniques that is most effective in producing a small file for compressing an individual training data sets of the plurality of training data sets;
    associating the particular technique with the individual training data set; and
    generating, for individual training data sets, a particular table based on the particular technique.

12. The computing device of claim 9, wherein:
    at least one of the first and second tables comprises a number of rows that represent a total number of symbols in the plurality of training data sets;
    the number of rows correspond to the symbols;
    each row of the number of rows comprises entries corresponding to each of the compression techniques;
    each particular entry in a row represents a probability that two immediately adjacent symbols are included in one or more training data sets of the plurality of training data sets that are mapped to the compression technique that is associated with the particular entry;
    at least one table of the one or more tables comprises a single row;
    the single row comprising individual entries corresponding to individual ones of the compression techniques, respectively; and
    individual entries representing a probability that a first two symbols of one or more training data sets of the plurality of training data sets is included in the one or more training data sets of the plurality of training sets that are associated with the compression technique corresponding to the individual entries.

13. The computing device according to claim 9, wherein the operations further comprise:
    determining information associated with one or more of:
       a textual context of the plurality of training data sets;

a list of the plurality of compression techniques;
a definition of a data space defining symbols appearing in the plurality of training data sets;
counts of transitions between two consecutive symbols;
probabilities of the transitions between two consecutive symbols;
probabilities that a specific compression technique is used to transition between two consecutive symbols; and
probabilities of initial conditions.

14. The computing device of claim 9, the operations further comprise:
reading one or more data blocks from a working data set;
determining for each particular data block of the one or more data blocks, which particular compression technique of the plurality of compression techniques produces a smallest result when compressing each particular data block;
compressing each particular data block of the one or more data blocks using the particular compression technique determined to produce the smallest result for each particular data block; and
writing the compressed data blocks to a storage device to create a compressed data set.

15. One or more non-transitory computer-readable storage media to store instructions executable by one or more processors to perform operations comprising:
determining a plurality of training data sets that include at least a first training data set and a second training data set;
compressing the first training data set using a first compression technique of a plurality of compression techniques;
compressing the first training data set using a second compression technique of the plurality of compression techniques;
performing a first comparison of:
compressing the first training data set using the first compression technique, with
compressing the first training data using the second compression technique;
determining, based on the first comparison, that compressing the first training data set using the first compression technique has a smaller size as compared to using the second compression technique;
compressing the second training data set using the first compression technique;
compressing the second training data set using the second compression technique;
performing a second comparison of:
compressing the second training data set using the first compression technique, with
compressing the second training data set the second compression technique;
determining, based on the second comparison, that compressing the second training data set using the second compression technique has the smaller size as compared to using the first compression technique;
associating the first training data set with the first compression technique;
associating the second training data set with the second compression technique;
creating a first table based on the first training data set;
creating a second table based on the second training data set;
creating a first matrix corresponding to the first compression technique, the first matrix comprising first rows and first columns;
creating a second matrix corresponding to the second compression technique, the second matrix comprising second rows and second columns;
wherein at least one entry in the first matrix and the second matrix corresponds to immediately adjacent symbols in the first and second training data sets; and
sending one or more tables including the first table and the second table to one or more computer systems for use in compressing sets of data stored on each of the one or more computer systems.

16. The one or more non-transitory computer-readable storage media of claim 15, wherein:
at least one entry of the first matrix includes a total number of instances in which the immediately adjacent symbols occur in the first training data set, and
at least one entry of the second matrix includes a total number of instances in which the immediately adjacent symbols occur in second training data set.

17. The one or more non-transitory computer-readable storage media of claim 15, wherein the operations further comprise:
compressing individual training data sets of the plurality of training data sets using the plurality of compression techniques;
determining a particular technique of the compression techniques that is most effective in producing a small file for compressing an individual training data sets of the plurality of training data sets;
associating the particular technique with the individual training data set; and
generating, for individual training data sets, a particular table based on the particular technique.

18. The one or more non-transitory computer-readable storage media of claim 15, wherein:
at least one of the first and second tables comprises a number of rows that represent a total number of symbols in the plurality of training data sets;
the number of rows correspond to the symbols;
each row of the number of rows comprises entries corresponding to each of the compression techniques;
each particular entry in a row represents a probability that two immediately adjacent symbols are included in one or more training data sets of the plurality of training data sets that are mapped to the compression technique that is associated with the particular entry;
at least one table of the one or more tables comprises a single row;
the single row comprising individual entries corresponding to individual ones of the compression techniques, respectively; and
individual entries representing a probability that a first two symbols of one or more training data sets of the plurality of training data sets is included in the one or more training data sets of the plurality of training sets that are associated with the compression technique corresponding to the individual entries.

19. The one or more non-transitory computer-readable storage media of claim 15, wherein the operations further comprise:
determining information associated with one or more of:
a textual context of the plurality of training data sets;
a list of the plurality of compression techniques;
a definition of a data space defining symbols appearing in the plurality of training data sets;

counts of transitions between two consecutive symbols;
probabilities of the transitions between two consecutive symbols;
probabilities that a specific compression technique is used to transition between two consecutive symbols; and
probabilities of initial conditions.

20. The one or more non-transitory computer-readable storage media of claim 15, wherein the operations further comprise:
reading one or more data blocks from a working data set;
determining for each particular data block of the one or more data blocks, which particular compression technique of the plurality of compression techniques produces a smallest result when compressing each particular data block;
compressing each particular data block of the one or more data blocks using the particular compression technique determined to produce the smallest result for each particular data block; and
writing the compressed data blocks to a storage device to create a compressed data set.

* * * * *